US012644009B2

(12) United States Patent
Norwood et al.

(10) Patent No.: US 12,644,009 B2
(45) Date of Patent: Jun. 2, 2026

(54) REFRACTIVE INDEX CONTRAST POLYMERS AND METHODS FOR PRODUCING AND USING THE SAME

(71) Applicant: ARIZONA BOARD OF REGENTS ON BEHALF OF THE UNIVERSITY OF ARIZONA, Tucson, AZ (US)

(72) Inventors: Robert Norwood, Tucson, AZ (US); Dong-Chul Pyun, Tucson, AZ (US); Stanley Pau, Tucson, AZ (US); Roland Himmelhuber, Tucson, AZ (US); Linan Jiang, Tucson, AZ (US); Thomas Koch, Tucson, AZ (US); Kyungjo Kim, Tucson, AZ (US); Sasaan Showghi, Tucson, AZ (US); Tristan Kleine, Tucson, AZ (US); Abhinav Nishant, Tucson, AZ (US); Julie Frish, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 321 days.

(21) Appl. No.: 18/554,239

(22) PCT Filed: Apr. 8, 2022

(86) PCT No.: PCT/US2022/023970

§ 371 (c)(1),
(2) Date: Oct. 6, 2023

(87) PCT Pub. No.: WO2022/217023

PCT Pub. Date: Oct. 13, 2022

(65) Prior Publication Data

US 2024/0166910 A1 May 23, 2024

Related U.S. Application Data

(60) Provisional application No. 63/173,346, filed on Apr. 9, 2021.

(51) Int. Cl.
*C09D 125/18* (2006.01)
*C09D 5/33* (2006.01)
(Continued)

(52) U.S. Cl.
CPC ........... *C09D 125/18* (2013.01); *C09D 5/004* (2013.01); *G02B 6/1228* (2013.01); *G03F 7/038* (2013.01); *G03F 7/039* (2013.01)

(58) Field of Classification Search
CPC ..... C09D 125/18; C09D 5/004; G02B 6/1228
See application file for complete search history.

(56) References Cited

U.S. PATENT DOCUMENTS 9,588,296 B2 * 3/2017 Heaton .................. G02B 6/125
10,324,260 B1 * 6/2019 Evans ........................ C09J 9/00
(Continued)

FOREIGN PATENT DOCUMENTS

WO WO-2020/150572 A1 7/2020

OTHER PUBLICATIONS

Fard, Ethan M., "Silicon Photonics Expanding Into Cyrogenics, and the Future of Optical Interconnects" Jan. 14, 2021; Dissertation, University of Arizona; Retrieved from https://repository.arizona.edu/handle/10150/650871 figure 3.6; section 3.3, p. 45, paragraph 1—p. 46, paragraph 1; section 3.5, p. 48, paragraph 1.
(Continued)

*Primary Examiner* — Rhonda S Peace
(74) *Attorney, Agent, or Firm* — Foley & Lardner LLP

(57) ABSTRACT

A photonic device including a first waveguide and a second waveguide is provided. The device includes an interconnect coupled with the first waveguide and the second waveguide. The interconnect includes a substrate. The interconnect includes a film including a refractive index contrast (RIC) polymer and a core. The core includes a first domain having a first refractive index. The core includes a second domain
(Continued)

adjacent to the first domain and having a second refractive index. The second refractive index is less than the first refractive index. The core includes a third domain adjacent to the second domain and having a third refractive index. The third refractive index is less than the second refractive index. The second domain is disposed between the first domain and the third domain. The refractive index of the substrate is less than the first refractive index, the second refractive index, and the third refractive index.

19 Claims, 25 Drawing Sheets

(51) Int. Cl.

| | |
|---|---|
| ***G02B 6/122*** | (2006.01) |
| ***G03F 7/038*** | (2006.01) |
| ***G03F 7/039*** | (2006.01) |

(56) References Cited

U.S. PATENT DOCUMENTS 10,698,164 B2 * 6/2020 Psaila ...................... G02B 6/13
11,662,523 B2 * 5/2023 Bian ...................... G02B 6/305 385/49
2016/0131837 A1 * 5/2016 Mahgerefteh .......... G02B 6/124 385/14
2021/0102012 A1 4/2021 Pyun et al.
2022/0244458 A1 * 8/2022 Koch ................... G02B 6/1221
2024/0166910 A1 * 5/2024 Norwood ............... G02B 6/305

OTHER PUBLICATIONS

Frisch, Julie, "Shades of Greyscale Tapers and Polymer Waveguides for Photonic Integrated Circuits", Jun. 22, 2021; Dissertation. (Oral Defense on Jan. 28, 2021) University of Arizona. Retrieved [Jun. 28, 2022] Retrieved from URL:https://repository.arizona.edu/handle/10150/660117; pp. 49-59.

International Search Report and Written Opinion for PCT/US22/23970 dated Jul. 27, 2022.

Kleine, Tristan, "Chalcogenide Hybrid Inorganic/Organic Polymers (CHIPs); Plastics for Infrared Imaging and Photonics", Jan. 20, 2020; Dissertation. University of Arizona. [Retrieved on Jun. 28, 2022] Retrieved from URL:https://repository.arizona.edu/handle/10150/636670; figures 6.1, and E.4- E.5; section 6.1, p. 104, paragraph 1, p. 106, paragraph 1; Section E.4.1, p. 204, paragraph 1—Section E.4.2, p. 205, paragraph 1.

* cited by examiner

REFRACTIVE INDEX CONTRAST POLYMERS AND METHODS FOR PRODUCING AND USING THE SAME

CROSS-REFERENCE TO RELATED APPLICATION

This application is a National Stage Entry of International Application No. PCT/US2022/023970, filed on Apr. 8, 2022, which claims the benefit of priority to U.S. Provisional Patent Application No. 63/173,346, filed on Apr. 9, 2021, the contents of which are incorporated herein by reference in their entirety.

STATEMENT REGARDING FEDERALLY FUNDED RESEARCH

This invention was made with government support under Grant No. FA8650-15-2-5220 awarded by Air Force Material Command. The government has certain rights in the invention.

FIELD

The present disclosure relates generally to the field of refractive index contrast polymers.

BACKGROUND

The microelectronics and communications industries have embraced parallelism to sustain performance improvement.

SUMMARY

At least one aspect of the present disclosure is directed to a photonic device. The photonic device includes a first waveguide and a second waveguide. The photonic device includes an interconnect coupled with the first waveguide and coupled with the second waveguide. The interconnect includes a substrate having a refractive index of the substrate. The interconnect includes a film including a refractive index contrast (RIC) polymer. The film coats the substrate and includes a core. The core includes a first domain having a first refractive index. The core includes a second domain adjacent to the first domain and having a second refractive index. The second refractive index is less than the first refractive index. The core includes a third domain adjacent to the second domain and having a third refractive index. The third refractive index is less than the second refractive index. The second domain is disposed between the first domain and the third domain. The refractive index of the substrate is less than the first refractive index, the second refractive index, and the third refractive index.

In some embodiments, the first refractive index, the second refractive index, and the third refractive index are in a range of about 1.40 to about 1.65. In some embodiments, the core includes a fourth domain adjacent to the third domain and having a fourth refractive index. The fourth refractive index is less than the third refractive index. The third domain is disposed between the second domain and the fourth domain.

In some embodiments, the substrate includes at least one of ethylene-tetrafluoroethylene (Tefzel™), polyvinyl alcohol, ethylene-vinyl alcohol, partially fluorinated acrylics, or perfluoropolymer. In some embodiments, the first waveguide or the second waveguide include at least one of a silicon (SI) photonic chip, a silicon nitride (SN) photonic chip, an indium phosphide (IP) photonic chip, an ion-exchange (IOX) glass optical printed circuit board, a silica-on-silicon photonic circuit, a lithium niobate photonic circuit, an optical fiber array, or an optical fiber interconnect subassembly.

In some embodiments, the RIC polymer includes a polymer produced from a monomeric mixture including from about 10% to about 90% of a fluorinated ethylenically unsaturated monomer and from about 90% to about 10% of a non-fluorinated ethylenically unsaturated monomer including an acid labile protecting group. In some embodiments, the acid labile protecting group includes at least one of tert-butoxycarbonyl ("BOC"), a silyl ether, a t-butyl ester, tetrahydropyran (THP), tetrahydrofuran (THF), a thioester, a thiocarbonyl, tert-butyl ether, or t-butyl sulfide.

In some embodiments, the RIC polymer has average molecular weight in the range from about 1,000 g/mole to about 1,000,000 g/mole. In some embodiments, the photonic device is at least one of an integrated splitter, a coupler, an arrayed waveguide grating, a modulator, a phase-shifter, a Mach-Zehnder interferometer, a directional coupler, a microring resonator, a mode converter, a grayscale adiabatic coupler, a laser, a detector, a tunable optical filter, a digital optical switch, a thermo-optic phase-shifter, or a variable optical attenuator.

In some embodiments, the first waveguide and the second waveguide are misaligned. In some embodiments, the first waveguide and the second waveguide are misaligned by about 3 μm or more.

Another aspect of the present disclosure is directed to a method for producing an interconnect between a first waveguide and a second waveguide. The method includes coupling the interconnect with the first waveguide and coupling the interconnect with the second waveguide. The interconnect includes a substrate having a refractive index of the substrate. The interconnect includes a film including a RIC polymer. The film coats the substrate and includes a core. The core includes a first domain having a first refractive index. The core includes a second domain adjacent to the first domain and having a second refractive index. The second refractive index is less than the first refractive index. The core includes a third domain adjacent to the second domain and having a third refractive index. The third refractive index is less than the second refractive index. The method includes disposing the second domain between the first domain and the third domain. The refractive index of the substrate is less than the first refractive index, the second refractive index, and the third refractive index.

In some embodiments, the first refractive index, the second refractive index, and the third refractive index are in a range of about 1.40 to about 1.65. In some embodiments, the core includes a fourth domain adjacent to the third domain and having a fourth refractive index. The fourth refractive index is less than the third refractive index. The method includes disposing the third domain between the second domain and the fourth domain.

In some embodiments, the first waveguide and the second waveguide are misaligned. In some embodiments, the core is produced by at least one of a mask lithography system, a maskless lithography system, or a direct laser writing system.

In some embodiments, the RIC polymer is produced from a mixture including a fluorinated ethylenically unsaturated monomer, a non-fluorinated ethylenically unsaturated monomer including an acid labile protecting group, and a photoacid generator. In some embodiments, the method includes photopatterning the RIC polymer to produce a photoexposed region and an unexposed region. The photoexposed region results in removal of the acid labile protecting group. The photoexposed region has a different refractive index compared to the unexposed region resulting in the photoexposed region defining the core.

In some embodiments, the substrate includes at least one of ethylene-tetrafluoroethylene (Tefzel™), polyvinyl alcohol, ethylene-vinyl alcohol, partially fluorinated acrylics, or perfluoropolyme. In some embodiments, the RIC polymer has average molecular weight in the range from about 1,000 g/mole to about 1,000,000 g/mole.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Figure 1:
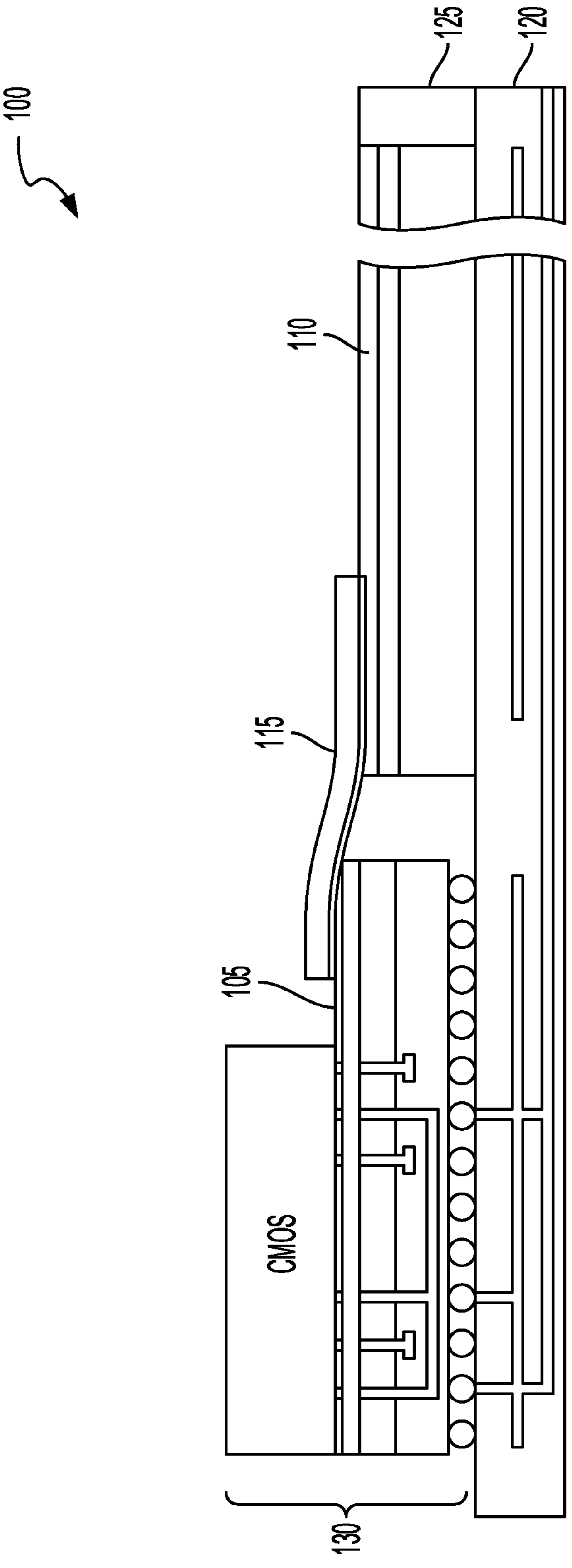
FIG. 1 illustrates a schematic of a photonic device, according to various embodiments.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s).

As utilized herein with respect to numerical ranges, the terms "approximately," "about," "substantially," and similar terms will be understood by persons of ordinary skill in the art and will vary to some extent depending upon the context in which it is used. If there are uses of the terms that are not clear to persons of ordinary skill in the art, given the context in which it is used, the terms will be plus or minus 10% of the disclosed values. When "approximately," "about," "substantially," and similar terms are applied to a structural feature (e.g., to describe its shape, size, orientation, direction, etc.), these terms are meant to cover minor variations in structure that may result from, for example, the manufacturing or assembly process and are intended to have a broad meaning in harmony with the common and accepted usage by those of ordinary skill in the art to which the subject matter of this disclosure pertains. Accordingly, these terms should be interpreted as indicating that insubstantial or inconsequential modifications or alterations of the subject matter described and claimed are considered to be within the scope of the disclosure as recited in the appended claims.

The use of the terms "a" and "an" and "the" and similar referents in the context of describing the elements (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential.

Since the end of clock frequency scaling of microprocessors in the mid-2000s, the microelectronics and communications industries have embraced parallelism to sustain performance improvement. Increasingly, the benefits of parallelism are constrained not by the limits of computation at individual nodes, but by data movement between nodes (e.g., the interconnect). While short-reach connectivity on-chip and within multi-chip modules (MCMs) can be achieved using electrical links, interconnect performance rapidly degrades at larger length scales (circuit boards) and beyond due to challenges with scaling frequency and distance. This is driving the increased consideration and deployment of optical interconnects, which do not suffer from the bandwidth limitations of their electrical counterparts as most dramatically borne out in the tremendous growth of the Internet. A parallel, low loss and inexpensive optical interconnect solution is a highly desirable technology for furthering the growth of the cloud infrastructure, which increasingly involves data center photonics and the basic concept of co-packaged optics that looks to tightly integrate photonic interconnects with electronic packaging solutions.

Photonic transceiver modules, now deployed on the scalable silicon photonics platform, enable optical signaling with high bandwidth and minimal loss over long distances with optical fiber. Further improvements may be achieved through a reduction in signaling energy and latency, while overall signaling capacity and photonic component density may be increased. During the past few decades, the basic building blocks of silicon photonic devices, such as modulators, detectors, switches, filters, and lasers, have been demonstrated. One of the main challenges remaining is a packaging approach that allows for convenient and efficient high density optical interconnection between photonic chips and board-level optical circuits and between photonic chips and optical fibers, while maintaining compatibility with CMOS processing and consuming minimal chip real estate. To meet this important challenge to enable the Optical Printed Circuit Board (OPCB), the revisiting of ion-exchange (IOX) glass as a robust optical substrate has garnered significant interest, due to the ability to create low loss waveguides operating in O-band and C-band for single-mode data center and telecom applications. Advantages of IOX waveguides can include panel level process capability, low fiber coupling (0.3 dB) and low propagation loss (<0.1 dB/cm) which enables OPCBs. However, a major technical challenge that remains is the creation of another level of optical packaging (i.e., "wiring") between IOX glass OPCBs with Si photonic platforms.

To date there have only been a few examples of any type of optical interconnect demonstration with IOX glass OPCBs (i.e., on-chip, or chip-to-chip), which points to the need for new optical interconnect media and materials for IOX glass substrates. More significantly, conventional optical interconnects require a precise height positioning requirement from one waveguide to another. Such a precision requirement adds to the overall time and cost.

Therefore, there is a need for a composition that can be used as an optical interconnect that is flexible to allow formation of an optical waveguide interconnect between two different waveguide elements without having to have precisely the same height or alignment between the different waveguide elements. There is also a need for a polymer that can be used in optical waveguide in which the refractive index contrast (Δn) can be tunable over a wide refractive index range to enable versatile implementation into different chip and system requirements.

The present disclosure provides various compositions, methods, and polymers, as well as photonic devices including and/or using the same. Some aspects of the disclosure provide a composition including photodefinable refractive index contrast (RIC) polymers and a flexible substrate. The RIC polymer can include a polymer in which the refractive index (n) of the polymer can be tuned. The refractive index of the RIC polymer can be tuned according to the amount of each of the components present. The flexible substrate have a lower refractive index than the refractive index of the RIC polymer. Such compositions can be used as an optical interconnect incorporating an adiabatic taper transition that is created through a designed progression of the refractive index difference (Δn) between the RIC polymer waveguide and an underlying waveguide system (e.g., silicon (SI) photonic chip, ion-exchange (IOX) glass optical substrate, an optical fiber array, etc.). In some embodiments, the refractive index changes progressively within the waveguide portion of the RIC polymer. This progression of the refractive index difference is referred to herein as a "grayscale taper," since a continuum of refractive index differences is present in the RIC polymers. The grayscale taper can be distinct from a physical taper. The grayscale taper can include spatially distinct domains (e.g., regions) can have different refractive indices. For example, the grayscale taper can include domains of increasing refractive index and/or decreasing diffractive index.

The systems and method of the present disclosure are directed to RIC polymers, flexible optical substrates, and methods for producing and using the same. The RIC polymers can be directly patterned using a photolithography process, thereby allowing the compositions to be used as an optical waveguide. In particular, the compositions may be used as an optical interconnect by incorporating an adiabatic taper transition that is created through a progression of the refractive index difference between the RIC polymer waveguide and an underlying waveguide system.

In some embodiments, the refractive index difference in the RIC polymer is realized through the use of an appropriate photoacid generator, effectively realizing an adiabatic waveguide transition. The term "adiabatic" refers to having substantially no loss of optical transmission through light radiated to the surrounding cladding. Alternatively, the term "adiabatic" refers to having optical transmission loss of at most about 2 dB or less, typically about 1.6 dB or less, often about 1.3 dB or less, and most often about 1 dB or less. Alternatively, the term "adiabatic" refers to having about 35% or less, typically about 30% or less, often about 25% or less, more often about 20% or less, and most often less than about 20% or loss of optical transmission at wavelength of 1310 nm and/or 1550 nm. Yet in other embodiments, the refractive index change from one end of the grayscale taper to the other end of the grayscale taper is from about 0.001 to about 0.1, typically from about 0.005 to about 0.02, and often from about 0.001 to about 0.01.

In some embodiments, a slab optical waveguide or an optical interconnect is predefined by deposition of the RIC polymer onto a suitable substrate, which typically has a lower refractive index than the RIC polymer. In some embodiments, the substrate is a flexible substrate. Still in other embodiments, the substrate is a flexible low refractive index substrate, For example, the refractive index of the flexible substrate is lower than the refractive index of RIC polymer core. Yet in other embodiments, the flexible low refractive index substrate also provides mechanical integrity of the composition.

As used herein, the term "flexible substrate" refers to a substrate that can bend, flex, or change curvature and/or height of at least about 300 μm over about 2000 μm of length, typically at least about 400 μm over about 2000 μm of length, often at least about 500 μm over about 2000 μm of length, and most often at least about 600 μm over about 2000 μm of length, without any significant loss of optical transmission (e.g., with adiabatic optical transmission through a grayscale adiabatic taper in the RIC polymer that serves as a waveguide). In one particular embodiment, the term "flexible substrate" refers to a substrate that can bend, flex, or change curvature and/or height of at least about 400 μm over 1500 μm of length. Accordingly, one of the features of optical interconnects (e.g., interconnects) provided in the present disclosure can be that the first and the second waveguide need not be precisely aligned. As used herein, the term "precisely aligned" means the output orifice of the first waveguide is aligned within a tolerance level to allow less than 5%, typically less than 3%, and often less than 2% loss of optical transmission to the input orifice of the second waveguide.

FIG. 1 illustrates a schematic of a photonic device 100 (e.g., device). The photonic device 100 can include at least one of an integrated splitter, a coupler, an arrayed waveguide grating, a modulator, a phase-shifter, a Mach-Zehnder interferometer, a directional coupler, a microring resonator, a mode converter, a grayscale adiabatic coupler, a laser, a detector, a tunable optical filter, a digital optical switch, a thermo-optic phase-shifter, or a variable optical attenuator.

The photonic device 100 can include a first waveguide 105. The first waveguide 105 can include a waveguide array (e.g., silicon photonic waveguide array, ion exchange waveguide array). The first waveguide 105 can include an interposer (e.g., active interposer, passive interposer). The first waveguide 105 can include an ASIC or processor interposer with 2.5D or 3D Si photonic stack with optical I/O ports. The first waveguide 105 can include at least one of a silicon (SI) photonic chip, a silicon nitride (SN) photonic chip, an indium phosphide (IP) photonic chip, an ion-exchange (IOX) glass optical printed circuit board, a silica-on-silicon photonic circuit, a lithium niobate photonic circuit, an optical fiber array, or an optical fiber interconnect subassembly.

The photonic device 100 can include a second waveguide 110. The second waveguide 110 can include a waveguide array (e.g., silicon photonic waveguide array, ion exchange waveguide array). The second waveguide 110 can include an interposer (e.g., active interposer, passive interposer). The second waveguide 110 can include an ASIC or processor interposer with 2.5D or 3D Si photonic stack with optical I/O ports. The second waveguide 110 can include at least one of a silicon photonic chip, a silicon nitride photonic chip, an indium phosphide photonic chip, an ion-exchange glass optical printed circuit board, a silica-on-silicon photonic circuit, a lithium niobate photonic circuit, an optical fiber array, or an optical fiber interconnect subassembly.

The photonic device 100 can include an interconnect 115 (e.g., polymer optical interconnect, polymer waveguide stitch, polymer interconnect, optical waveguide, flexible optical waveguide). The interconnect 115 can be coupled with the first waveguide 105. For example, the interconnect 115 can be operatively connected with the first waveguide 105. The interconnect 115 can be in physical contact with the first waveguide 105. The interconnect 115 can be coupled with the second waveguide 110. For example, the interconnect 115 can be operatively connected with the second waveguide 110. The interconnect 115 can be in physical contact with the second waveguide 110. The first waveguide 105 and the second waveguide 110 can be connected (e.g., flexibly connected) via the interconnect 115.

The photonic device 100 can include a printed circuit board (PCB) 120 (e.g., underlying PCB). The first waveguide 105 can be disposed on the PCB 120. The second waveguide 110 can be disposed on the PCB 120. The PCB 120 can include an edge connector 125 (e.g., module edge connector). The edge connector 125 can be plugged into a matching socket of a computer. The edge connector 125 can include metallic tracks. The photonic device 100 can include a circuit 130 (e.g., ASIC, processor interposer).

Figure 2:
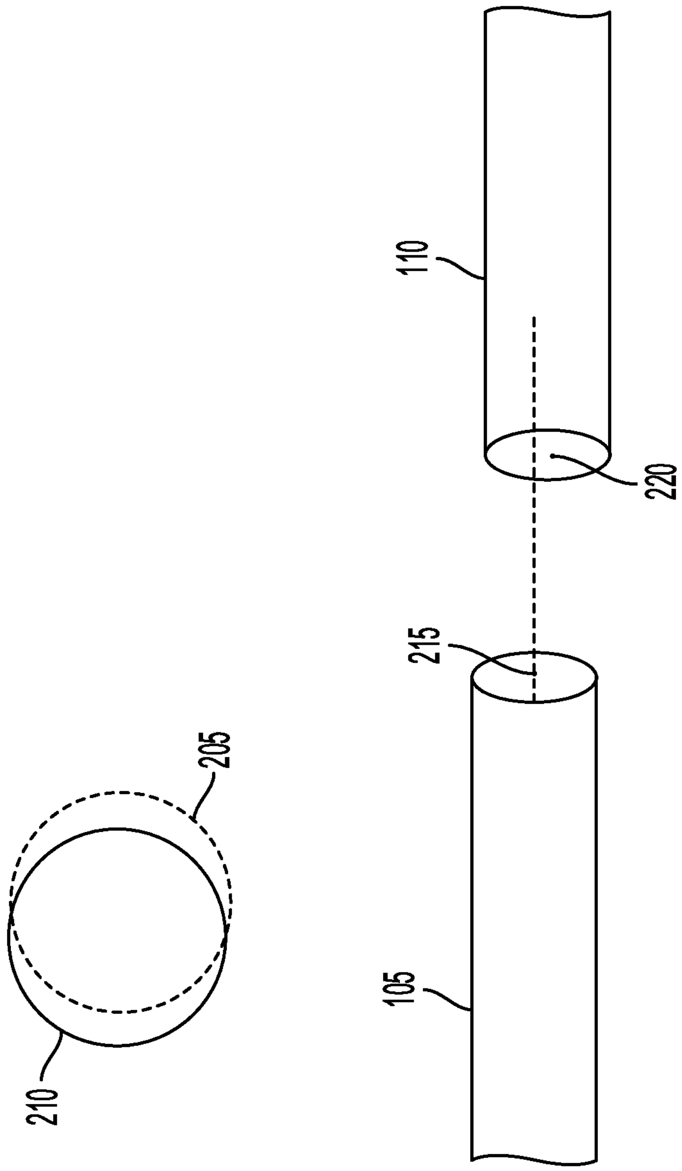
FIG. 2 illustrates a schematic of misaligned optical waveguides, according to various embodiments.

A conventional optical interconnect waveguide can require a precise alignment between the first waveguide and the second waveguide. In contrast to conventional optical interconnects, compositions and methods of the present disclosure allow optical interconnect waveguides between two slightly misaligned waveguides without any significant loss of optical transmission. Misalignments between two optical waveguides are schematically illustrated in FIG. 2. The term "slightly misaligned" can include loss of optical transmission from one optical waveguide to another optical waveguide of at least about 5%, typically at least about 3%, often at least about 2% loss of optical transmission. The first waveguide 105 can be misaligned with the second waveguide 110. The first waveguide 105 and the second waveguide 110 can be misaligned by about 3 μm or more. The first waveguide 105 can include an output orifice 205. The output orifice 205 can include an output orifice center 215. The output orifice center 215 can be positioned on a longitudinal axis of the first waveguide 105. The output orifice center 215 can be positioned on a longitudinal axis of the first waveguide 105 passing through the center of the output orifice 205. The second waveguide 110 can include an input orifice 210. The input orifice 210 can include an input orifice center 220. The input orifice center 220 can be positioned on a longitudinal axis of the second waveguide 110. The output orifice center 215 can be positioned on a longitudinal axis of the second waveguide 110 passing through the center of the input orifice 210. The output orifice 205 and the input orifice 210 can be misaligned. For example, the output orifice center 215 can be positioned a distance from the longitudinal axis of the second waveguide 110. The input orifice center 220 can be positioned a distance from the longitudinal axis of the first waveguide 105.

As stated above, one of the advantages of compositions of the present disclosure can be based at least in part on the class of photonic polymers termed Refractive Index Contrast (RIC) polymers. The RIC polymers of the disclosure can be applied as optical interconnects for a wide range of prefabricated waveguide arrays, without the need for altering existing process or product lines. At the same time, RIC polymers of the disclosure provide an avenue for new, low-cost, high-yield processes to be developed and used. In some embodiments, RIC polymers of the disclosure allow modulation of refractive index (e.g., in solution cast thin films) with precise spatial control using photolithography tools with or without using a mask. As discussed herein, RIC polymers of the disclosure allow various optical interconnects to be produced using various methods (e.g., photolithographic writing system) where large Δn regions can be readily photopatterned to create adiabatic optical waveguide transitions. In one particular embodiment, adiabatic optical waveguides of the disclosure have less than 3% power loss at wavelengths at 1310 nm and/or 1550 nm. In some embodiments, an adiabatic grayscale tapered optical waveguide is fabricated using compositions of the disclosure that includes a RIC polymer via a maskless lithography process, a grayscale mask, or a direct laser writing system. Still in other embodiments, optical waveguides of the disclosure exhibit low loss adiabatic coupling (e.g., about 3 dB or less, typically about 2 dB or less, often about 1.5 dB or less, and most often about 1 dB or less at 1550 nm) to IOX waveguides through the formation of grayscale tapers.

An adiabatic waveguide transition can refer to a transition that occurs between two waveguide structures that takes place gradually enough with propagation distance so that minimal power loss or transfer takes place between the structure's fundamental modes as the light transitions from one waveguide to the other. In effect, the light stays in the same mode of the composite structure, although the shape and position of the mode may change gradually during this transition. This transition can be achieved through a physical tapering of one of the waveguide structures, often requiring state-of-the-art lithographic processing.

Figure 3A:
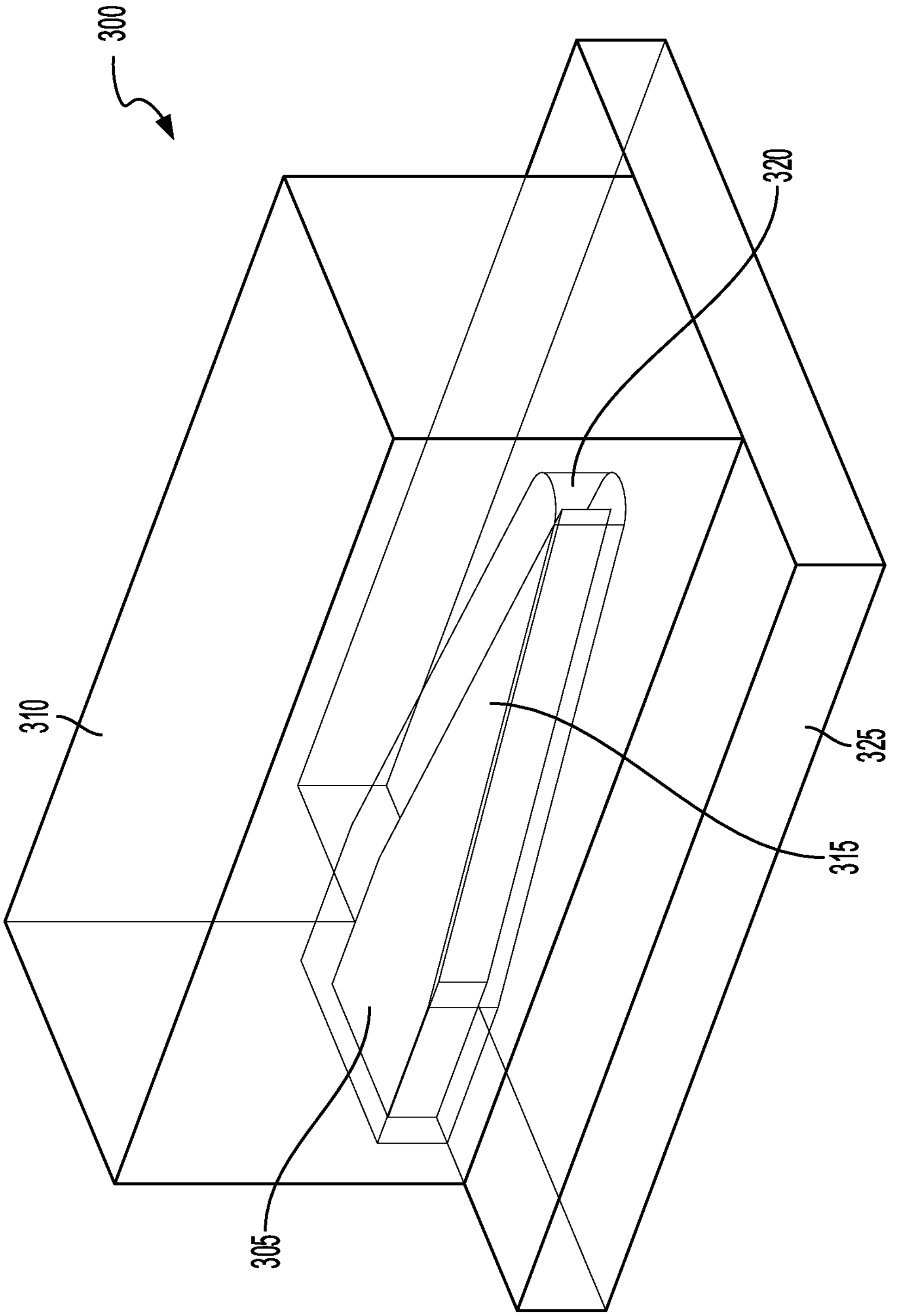
FIGS. 3A and 3B illustrate physical adiabatic waveguide tapers.
Figure 3B:
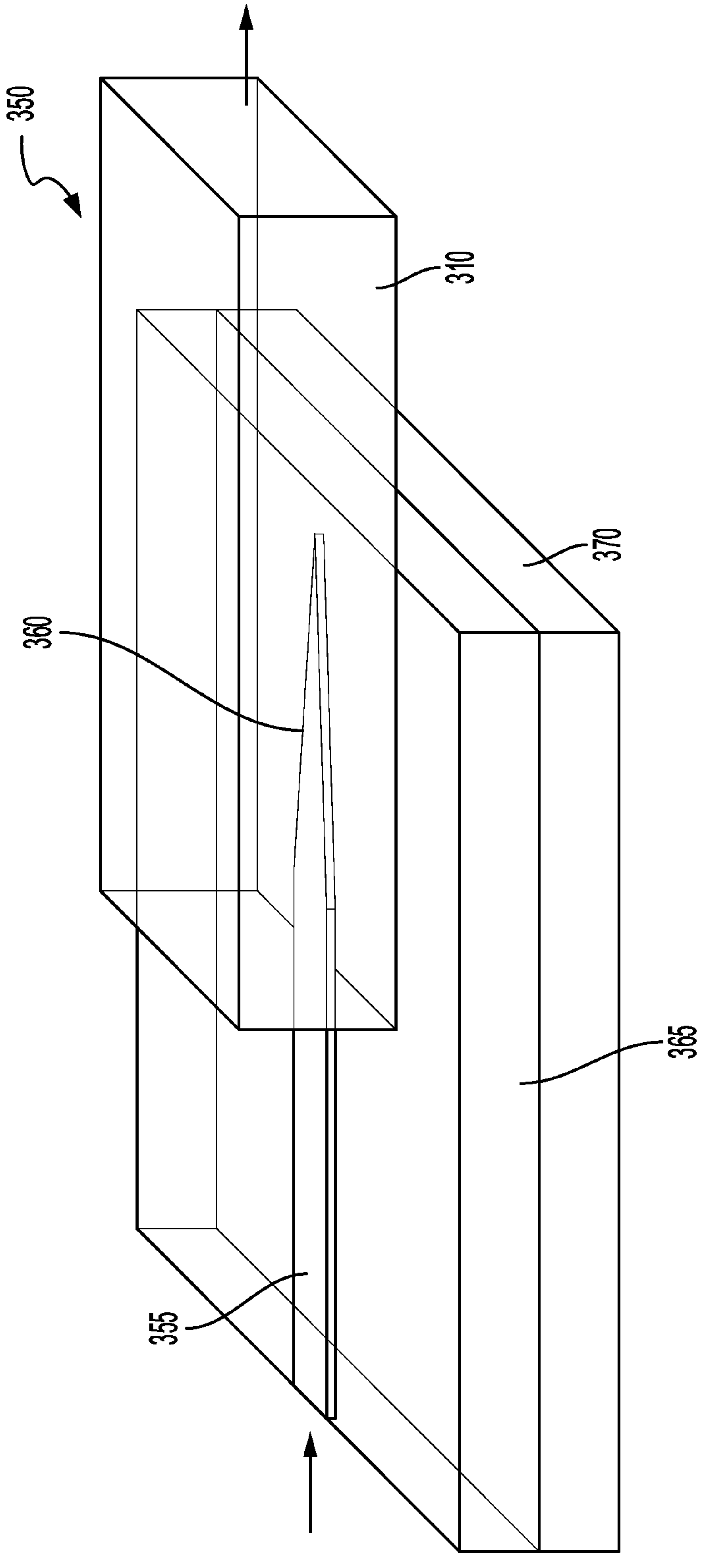

FIGS. 3A and 3B illustrate physical adiabatic waveguide tapers. The physical adiabatic waveguide tapers can include realize an adiabatic waveguide transition from a silicon waveguide to a polymer waveguide and silicon nitride waveguide to a polymer waveguide. FIG. 3A illustrates a structure 300 used to realize an adiabatic waveguide transition from a silicon waveguide to a polymer waveguide. The structure 300 can include a silicon waveguide 305, a polymer waveguide 310, a silicon nano-taper 315, an oxidized $SiO_2$ cladding layer 320, and a $SiO_2$ substrate 325. FIG. 3B illustrates a structure 350 used to realize an adiabatic waveguide transition from a silicon nitride waveguide to a polymer waveguide. The structure 350 can include a SiN waveguide 355, the polymer waveguide 310, a SiN nano-taper 360, a $SiO_2$ cladding layer 365, and a silicon substrate 370.

Figure 4:
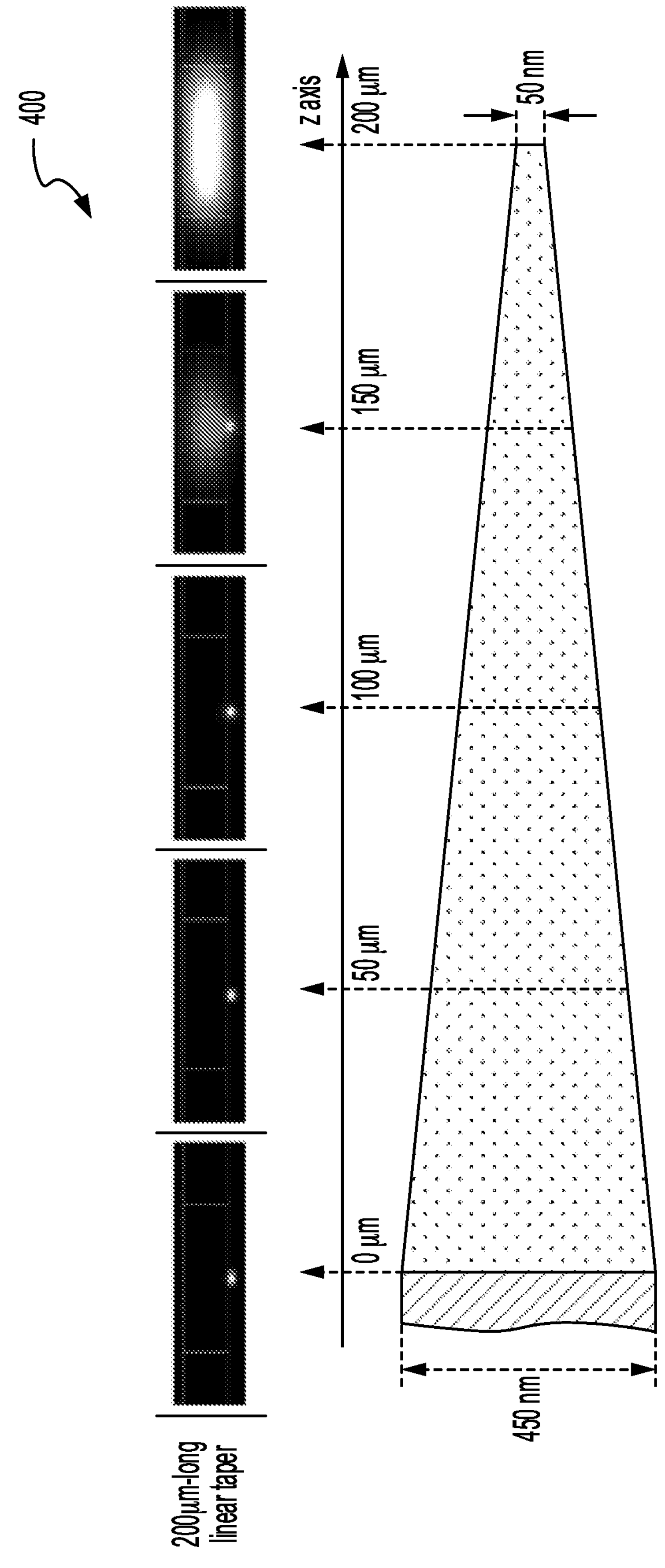
FIG. 4 illustrates light propagation through a physical adiabatic waveguide taper.

FIG. 4 illustrates light propagation through a physical adiabatic waveguide taper 400. FIG. 4 shows a simulation of light transferring from a silicon waveguide to an overlaying polymer waveguide with minimal optical radiation loss. Light propagation through the structure can evidence that light remains confined to the structure throughout the transition (e.g., no radiation). The effect of the physical taper is to gradually lower the effective index of the waveguide mode so that it eventually matches that of the polymer waveguide. Physical tapers typically range in length from a few hundred microns to several millimeters, with low optical loss generally occurring in longer, more gradual tapers.

In contrast to conventional methods, compositions of the disclosure allow creation of an adiabatic transition without the need of forming a physical taper structure. A grayscale adiabatic transition is accomplished using compositions of the disclosure by gradually varying the refractive index of the RIC polymer in the optical channel. In one particular embodiment, the adiabatic transition of the RIC polymer is achieved through varying the exposure to the actinic radiation such that a refractive index grayscale is achieved. The refractive index at optical communications wavelengths such as 1310 nm and 1550 nm can be changed by up to 0.04, and more typically by 0.01-0.02 through exposure at 375 nm with doses of 500-1000 $mJ/cm^2$. However, it should be appreciated that the scope of the disclosure is not limited to this range of refractive index difference. In general, any range of refractive index differences can be achieved within the available range, for example, by controlling the exposure dose.

Figure 5:
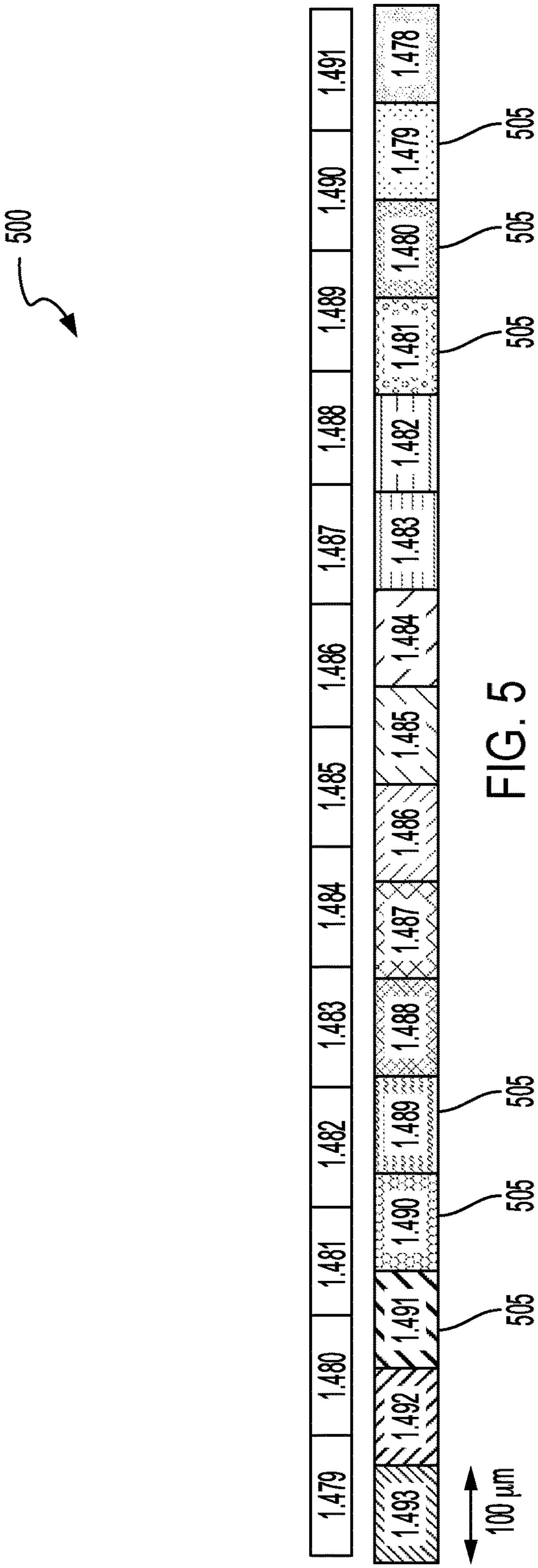
FIG. 5 illustrates an exemplary grayscale pattern, where the index is changed along the light propagation direction, according to the examples.

FIG. 5 shows an exemplary grayscale pattern 500, where the refractive index is changed along the light propagation direction in 16 steps of approximately 100 microns each with each step corresponding to a refractive index change of 0.001. The grayscale taper in RIC polymers achieves the same objective as the conventional physical taper, but without the need for material removal as would be ordinarily achieved by wet or dry etching. This intrinsically improves the fidelity of the process as the desired pattern is written directly into the RIC polymer, with no pattern transfer required. The pattern can include a plurality of domains 505. For example, the domains 505 can have different refractive indices. The difference between the refractive indices of adjacent domains 505 can be 0.001. For example, the domains can have refractive indices of 1.493, 1.492, 1.491, 1.490, 1.489, 1.488, 1.487, 1.486, 1.485, 1.484, 1.483, 1.482, 1.481, 1.480, 1.479, or 1.478.

Figure 6:
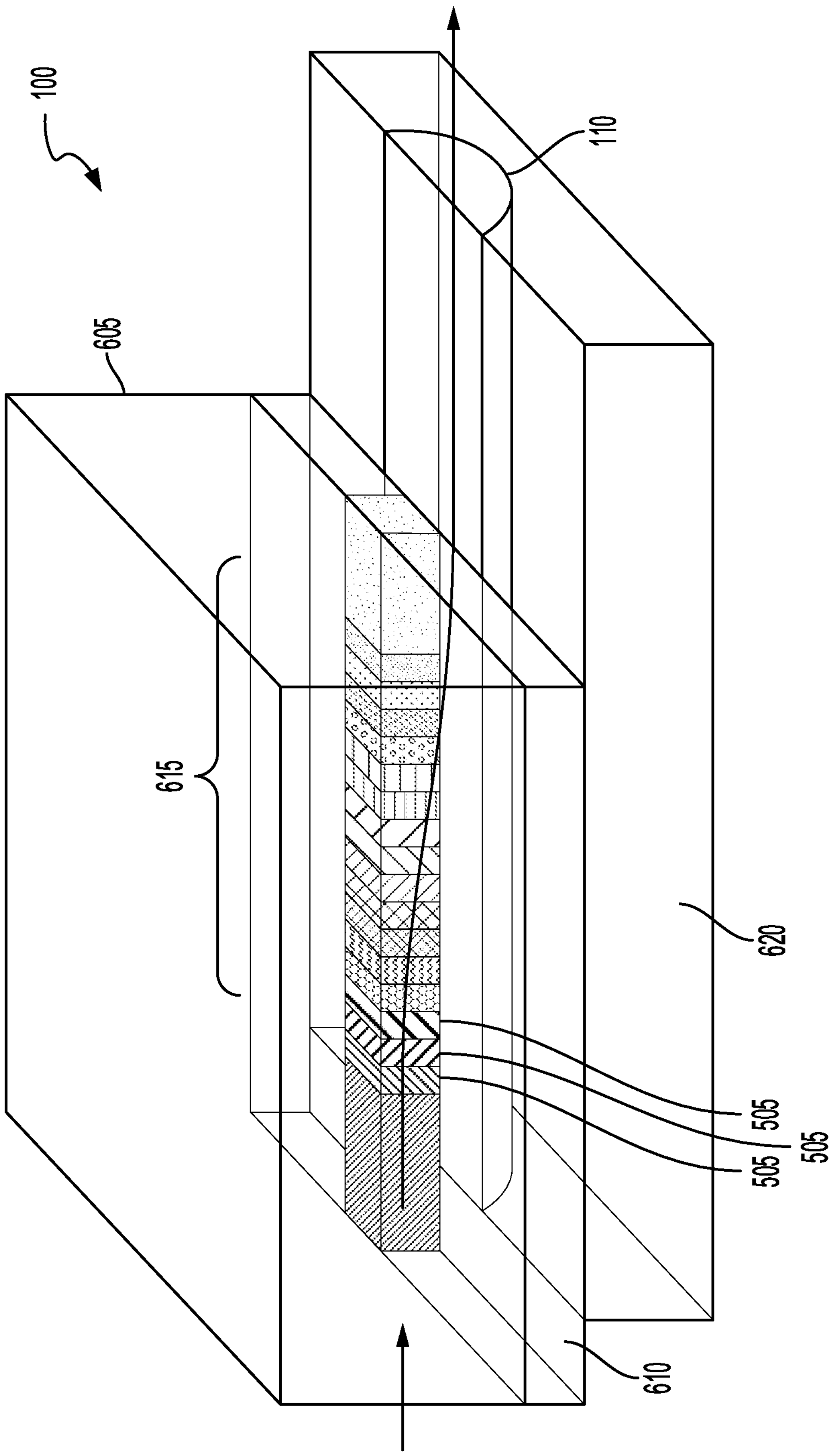
FIG. 6 illustrates a schematic of the photonic device, according to various embodiments.

FIG. 6 illustrates a schematic of the photonic device 100. The grayscale taper can be used to adiabatically transition light from a polymer waveguide to an IOX glass waveguide. Light is transmitted into a polymer waveguide of the disclosure whose refractive index can be controlled by exposure to appropriate radiation. The polymer (e.g., RIC polymer) can be coated onto a substrate 605 (e.g., a low refractive index fluoropolymer such as Tefzel®). The substrate 605 can include a cladding layer (e.g., flexible low refractive index substrate). The substrate 605 can be flexible. The substrate 605 can have a refractive index of the substrate 605. The substrate 605 can include at least one of ethylene-tetrafluoroethylene (Tefzel™), polyvinyl alcohol, ethylene-vinyl alcohol, partially fluorinated acrylics, or perfluoropolymer.

The photonic device 100 can include a film 610. The film 610 can be coated onto the substrate 605. The film 610 can be made of the RIC polymer. The RIC polymer can include a polymer produced from a monomeric mixture including from about 10% to about 90% of a fluorinated ethylenically unsaturated monomer and from about 90% to about 10% of a non-fluorinated ethylenically unsaturated monomer including an acid labile protecting group. The the acid labile protecting group can include at least one of tert-butoxycarbonyl ("BOC"), a silyl ether, a t-butyl ester, tetrahydropyran (THP), tetrahydrofuran (THF), a thioester, a thiocarbonyl, tert-butyl ether, or t-butyl sulfide. The RIC polymer can have an average molecular weight in the range from about 1,000 g/mole to about 1,000,000 g/mole. The film 610 can have a thickness of 5 microns.

The film 610 can include a core 615. The core 615 (e.g., polymer core) can include the plurality of domains 505. For example, the photonic device can include a first domain 505, a second domain 505, and a third domain 505. The first domain 505 can have a first refractive index. The second domain 505 can be adjacent to the first domain 505. The second domain 505 can have a second refractive index. The second refractive index can be less than the first refractive index. The third domain 505 can be adjacent to the second domain 505. The third domain 505 can have a third refractive index. The third refractive index can be less than the second refractive index. The second domain 505 is disposed between the first domain 505 and the third domain 505. The first refractive index, the second refractive index, and the third refractive index can be greater than the refractive index of the substrate 605. The refractive index of the substrate 605 can be less than the first refractive index, the second refractive index, and the third refractive index. The core 615 can include domains 505 that have refractive indices that decrease or increase from the first domain 505 to the third domain 505. The substrate 605 can have a low refractive index. For example, the substrate 605 can have a lower refractive index than the core 615. The core 615 can have a refractive index that is less than the refractive index of the substrate 605. In some embodiments, the first refractive index, the second refractive index, and the third refractive index are in a range of about 1.40 to about 1.65. The core 615 can include a fourth domain 505 adjacent to the third domain 505. The fourth domain 505 can have a fourth refractive index. The fourth refractive index can be less than the third refractive index. The third domain 505 can be disposed between the second domain 505 and the fourth domain 505.

The core 615 can include three or more domains 505. For example, the core 615 can include 3 domains, 4 domains, 8 domains, 12 domains, 16 domains, 24 domains, 32 domains, 40 domains, or more domains. FIG. 6 depicts a core 615 with 16 distinct domains, but it is understood that the core 615 can contain greater than or less than 16 domains. The core 615 can have 16 steps toward a vanishing lateral core. The domains 505 can have different or the same refractive indices. The refractive index of adjacent domains can be different. The refractive index of a domain 505 near the first waveguide 105 can be similar to or the same as the refractive index of the first waveguide 105. The refractive index of a domain 505 near the second waveguide 110 can be similar to or the same as the refractive index of the second waveguide 110. The domains 505 can be aligned along the core 615 of the interconnect 115. The grayscale taper can include the core 615. The grayscale taper can include the domains 505. The core 615 can include spatially distinct domains 505.

The film 610 can be placed on the first waveguide 105 or the second waveguide 110. The second waveguide 110 can be disposed in a glass substrate 620. The interconnect 115 can include the film 610 and the substrate 605. The film 610 can be placed on top of an ion-exchange (IOX) glass waveguide with a refractive index close to that of the RIC polymer core and the light initially transmitted into the RIC polymer core adiabatically transitions to the underlying IOX glass waveguide as shown.

As stated above, compositions and methods of the disclosure can be based on RIC polymers. In some embodiments, RIC polymers of the disclosure enable modulation of refractive index (RI) in solution cast thin films with spatial control using photolithography tools. Still in other embodiments, RIC polymers of the disclosure provide a streamlined fabrication process via photolithographic writing into RIC polymer core, where large $\Delta n$ regions can be photopatterned to create low loss, single-mode polymeric waveguides at telecommunication wavelengths (e.g., 1310 and 1550 nm). Furthermore, RIC polymers of the disclosure can be used to create a new class of optical polymers that can streamline the fabrication of polymeric waveguide devices for advanced photonic applications, such as interconnecting silicon photonics and optical networking fibers, etc.

In some embodiments, RIC polymers of the disclosure are produced from a monomeric mixture that includes a fluorinated ethylenically unsaturated monomer and a non-fluorinated ethylenically unsaturated monomer. The non-fluorinated ethylenically unsaturated monomer can include a functional group that is protected by an acid labile protecting group.

One aspect of the disclosure provides a polymer produced from a monomeric mixture including (i) from about 10% to about 90%, typically from about 10% to about 80%, often from about 20% to about 70%, more often from about 25% to about 60%, and most often from about 30% to about 50% of a fluorinated ethylenically unsaturated monomer, (ii) from about 90% to about 10%, typically from about 90% to about 20%, often from about 80% to about 30%, more often from about 75% to about 40%, and most often from about 70% to about 50% of a non-fluorinated ethylenically unsaturated monomer including an acid labile protecting group.

In one embodiment, the fluorinated ethylenically unsaturated monomer includes a fluorinated methacrylate, a fluorinated acrylate, vinyl fluoride, fluorostyrene, fluorinated norbornene, fluorinated cyclic esters, fluorinated cyclic amides, fluorinated cyclic ethers, fluorinated vinyl ethers, fluorinated epoxides, fluorinated thiiranes, or a combination thereof.

Still in another embodiment, the acid labile protecting group includes tert-butoxycarbonyl ("BOC"), a silyl ether, a t-butyl ester, tetrahydropyran (THP), tetrahydrofuran (THF), a thioester, a thiocarbonyl, tert-butyl ether, t-butyl sulfide, or a combination thereof.

Yet in another embodiment, the polymer has refractive index of from about 1.4 to about 1.7, typically from about 1.42 to about 1.65, often from about 1.42 to about 1.6, and most often from about 1.45 to about 1.56 at telecommunication wavelengths. As used herein, the term "telecommunication wavelengths" refers to electromagnetic wavelengths that are used in telecommunication, typically ranging from about 1200 nm to about 1600 nm and typically from about 1300 nm to about 1600 nm. In one particular embodiment, telecommunication wavelengths are about 1310 nm and/or about 1550 nm.

Still yet in another embodiment, the polymer has average molecular weight in the range from about 1,000 g/mole to about 1,000,000 g/mole, typically from about 1,500 g/mole to about 900,000 g/mol, often from about 2,000 g/mole to about 800,000 g/mole.

Another aspect of the disclosure provides a composition adapted for producing a refractive index contrast polymer for use as an optical waveguide, the composition including (i) a polymer as described herein and a photoacid generator. As used throughout this disclosure, the terms "those defined above," "those defined herein," "as described herein," "as described above," "described herein," and "described above" are used interchangeably and incorporates by reference the broad definition of as well as any narrower definition(s), if any. In some embodiments, the composition further includes a solvent.

One particular example for producing an optical waveguide using RIC polymers of the disclosure is illustrated below. In particular, the method can include depositing (e.g., via solution processing, chemical vapor deposition, or other methods known to one skilled in the art) the composition described herein on a substrate (e.g., silicon chip, IOX, fiber optic, or other waveguide known to one skilled in the art) to form a thin polymer film on the substrate. The method can include photopatterning the RIC polymer film (e.g., using a laser or other photolithography systems) to produce a photoexposed region and an unexposed region. The photoexposed region can result in removal of the acid labile protecting group. For example, photoexposing the region can result in removal of the acid labile protecting group.

The photoexposed region has a different refractive index compared to the unexposed region resulting in the photoexposed region defining an optical waveguide. It should be appreciated that the physical structure of the RIC polymer may not change significantly (e.g., less than about 5%, typically less than about 3%, often less than about 2%, and most often less than about 1%) but only the refractive index changes in the photoexposed region.

In some embodiments, the polymer is post exposure baked (PEB) in order to prevent further removal of the acid labile protecting group. Still in other embodiments, the photoexposed region has a refractive index that is higher than that of the unexposed region. In one particular embodiment, the refractive index of the photoexposed region is from about 0.001 to about 0.2, typically 0.001 to 0.1, often 0.01 to 0.05, more often 0.01 to 0.03, still more often 0.01 to 0.02, and most often 0.01 to 0.1 higher than the refractive index of the unexposed region. Typically, the photoexposed region is used to form a grayscale adiabatic transition or taper. In some embodiments, the refractive index difference from one end of the grayscale adiabatic taper to the other end (e.g., from one end of the core 615 to the other end of the core 615) is from about 0.001 to about 0.04, typically from about 0.001 to about 0.02, and often from about 0.001 to about 0.05.

The photopatterning step can be achieved using a mask lithography system, maskless lithography system, or a direct laser writing system. In one particular embodiment, the photopatterning step includes a maskless lithography system or a direct laser writing system.

The waveguide device produced using compositions of the disclosure can be incorporated in or can be used in an integrated splitter, coupler, arrayed waveguide grating, modulator, phase-shifter, Mach-Zehnder interferometer, wavelength selective switch, transceiver, coherent transceiver, directional coupler, microring resonator, mode converter, laser, detector, grayscale adiabatic coupler, tunable optical filter, digital optical switch, thermo-optic phase-shifter, variable optical attenuator, or any photonic device that utilizes an optical waveguide.

Yet another aspect of the disclosure provides a photonic device including an array of a plurality of optical waveguides and an optical interconnect between the waveguides, wherein the optical interconnect is fabricated by a process disclosed herein.

Figure 7:
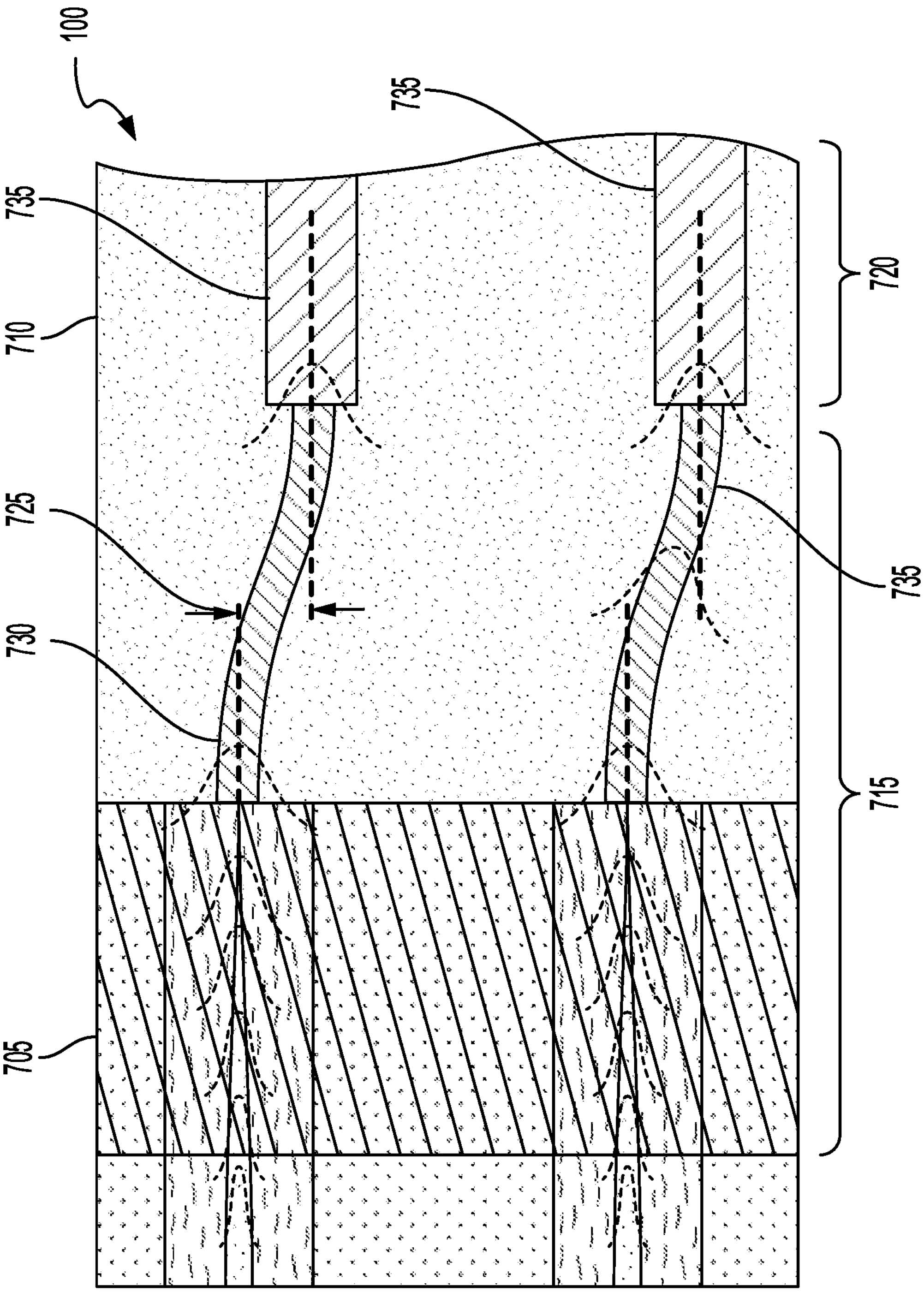
FIG. 7 illustrates a schematic of the "SmartPrint" process, according to various embodiments.

In contrast to typical polymers used in photolithography, upon photoexposure, RIC polymers of the disclosure in the presence of a photoacid generator creates regions of refractive index contrast instead of solubility changes. This allows fabrication of a novel optical interconnect media as both the global RI of the RIC polymer and $\Delta n$ can be tuned by copolymerization methods to index match device requirements over the wide range of n, e.g., from about 1.42 to about 1.56. RIC polymer interconnects of the present disclosure thus have the ability to access numerous photonic platforms, including SI photonic chip, SN photonic chip, IP photonic chip, IOX glass optical printed circuit board, IOX glass photonic chip, a silica-on-silicon photonic circuit, a lithium niobate photonic circuit, an optical fiber array, and optical fiber interconnect subassemblies, through a novel process that is termed “SmartPrint” as schematically illustrated in FIG. 7. SmartPrint allows for rapid dry film lithographic fabrication of single-mode optical interconnects between individual silicon photonics chips or between chips and an underlying OPCB using maskless lithography systems, for example. The SmartPrint process can include connecting a slab RIC polymer waveguide fabric to a silicon photonic chip on the left and an IOX glass waveguide array on the right. FIG. 7 illustrates a schematic of the photonic device 100. The photonic device 100 can include a chip 705 with nanotapers, a polymer waveguide fabric 710, a polymer pre-fabricated slab (writable) 715, and an IOX glass pre-fabricated guide array 720. The photonic device 100 can include an alignment offset 725, a selective laser melting (SLM) printed waveguide core 730, and a pre-fabricated IOX glass waveguide core 735.

As illustrated throughout this disclosure, compositions and methods of the present disclosure allow a dramatically new approach to optical interconnects using photoresponsive fluorinated RIC polymers with a low or minimal optical propagation loss. Use of RIC polymers as on-chip interconnects was tested for waveguide arrays on IOX glass substrates to demonstrate the versatility of these materials to both tune RI and index contrast to enable grayscale adiabatic coupling to these pre-fabricated device components. Furthermore, the manufacturing potential of compositions and methods of the disclosure can be demonstrated by directly spin coating RIC polymers onto IOX glass waveguide arrays and directly fabricating waveguiding interconnects with excellent spatial control via maskless photolithography. This demonstrates the versatility of the RIC polymer for optical packaging applications and further demonstrates a novel packaging solution for IOX glass substrates which has broad impacts for OPCB implementation, as evidenced by the “SmartPrint” described herein.

Figure 8:
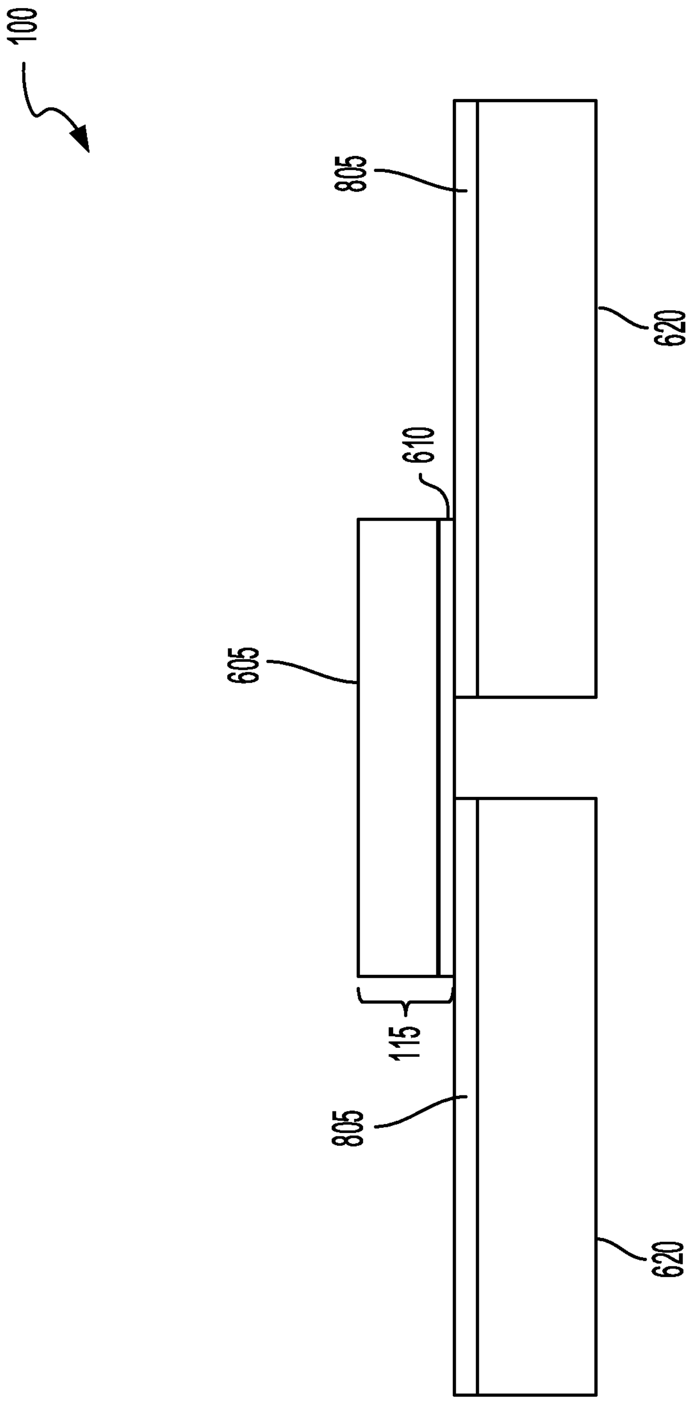
FIG. 8 illustrates a schematic of the photonic device, according to various embodiments.

Another aspect of the disclosure is the use of a predefined slab waveguide by depositing the RIC polymer onto a substrate that has a lower refractive index than the unexposed RIC polymer. In many cases, the out-of-plane waveguide confinement can be provided by this underlying low refractive index substrate and air (n=1) on the other side of the RIC polymer film. This film can be placed down as shown in FIG. 8 so that it covers the optical waveguides of interest; in this illustration the objective is to transfer light from one IOX glass chip to the other. FIG. 8 illustrates a schematic of the photonic device 100. The photonic device 100 can include a predefined FS-BOC polymer/Tefzel slab waveguide placed on top of two IOX glass waveguide chips in preparation for lateral patterning of the FS-BOC film to effect an optical interconnection between the two IOX glass chips. In a typical implementation, a maskless lithography system is used to identify the in-plane position of the two IOX glass waveguides, and then an appropriate connecting laterally confined waveguide is photodefined in the RIC polymer film by programming the maskless lithography system, i.e., SmartPrint process. The photonic device 100 can include one or more glass substrates 620 (e.g., IOX glass), one or more IOX waveguide layers 805, the substrate 605 and the film 610. The photonic device 100 can include the interconnect 115. The interconnect 115 can include the substrate 605 and the film 610. The interconnect 115 can be formed between two IOX glass chips. The thickness of the film 610 can be approximately 5 μm.

Figure 9:
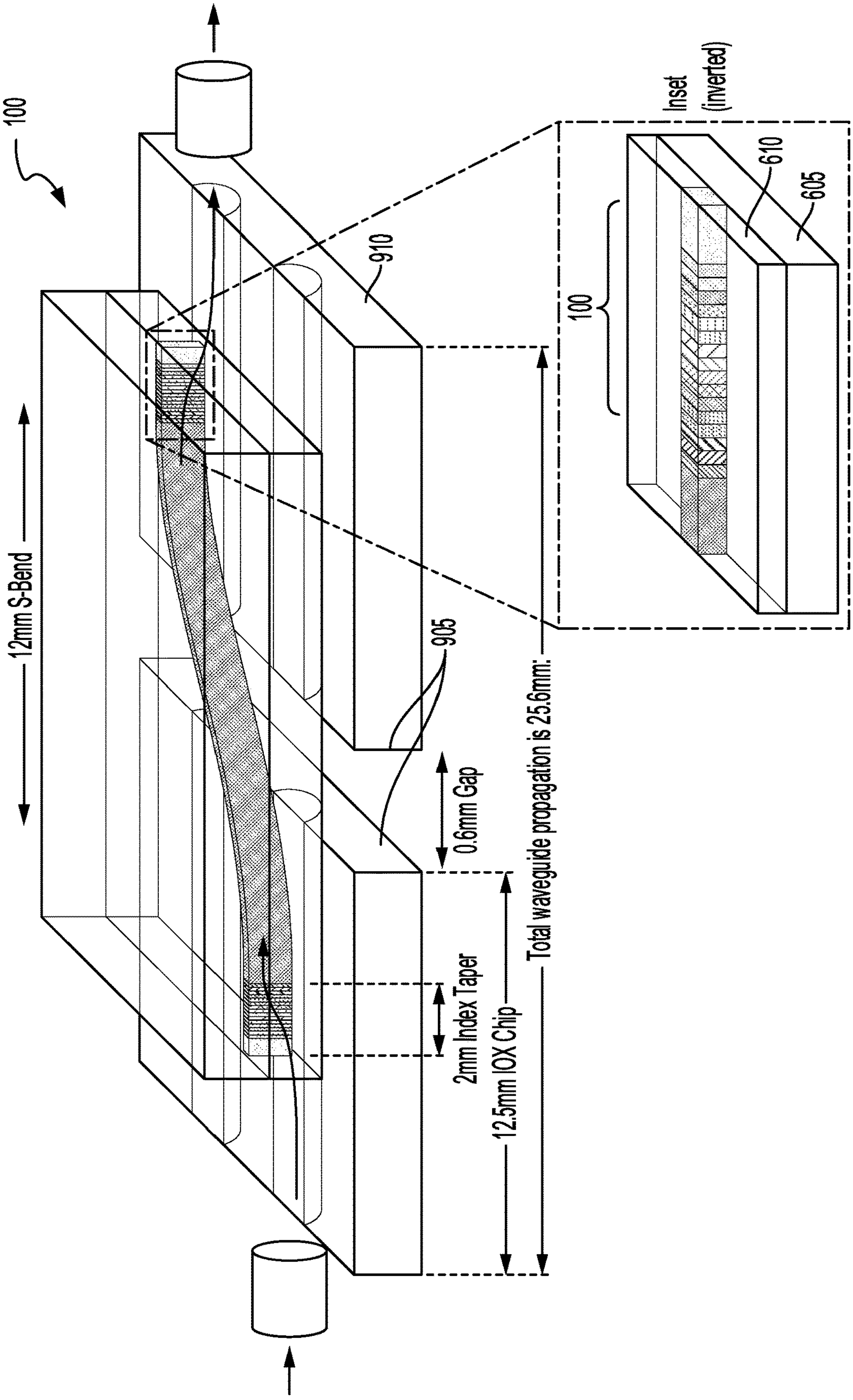
FIG. 9 illustrates a schematic of the photonic device, according to various embodiments.

FIG. 9 illustrates a schematic of the photonic device 100. FIG. 9 shows a full implementation of the RIC polymer enabled, prefabricated slab waveguide, adiabatic grayscale taper optical interconnect. A full implementation of an optical waveguide of the disclosure is used as an optical interconnect for two waveguides that are out-of-plane or misaligned, employing grayscale adiabatic waveguide transitions and a predefined slab RIC polymer waveguide with optimized S-bends. The photonic device 100 can include rough diced IOX facets 905 and a polished IOX facet 910. The photonic device 100 can include the substrate 605 and the film 610.

One of the components of compositions and methods of the disclosure is a flexible low refractive index substrate. Another component of compositions and methods of the disclosure is based RIC polymers. In particular, the refractive index (n) of RIC polymers of the disclosure can be fine tuned using photolithography to fabricate an optical waveguide. This ability to fine tune the refractive index allows one to create an adiabatic taper transition by designing a progression of the refractive index differences between the RIC polymer waveguide and an underlying waveguide system (e.g., ion-exchange glass). In particular, a continuum of refractive index differences can be realized in the RIC polymers through the use of an appropriate photoacid generator, effectively realizing an adiabatic waveguide transition. A slab optical waveguide is predefined by deposition of the RIC polymer onto a suitable substrate, which typically has a lower refractive index than the RIC polymer core. Typically, the substrate is a flexible low refractive index substrate that can also provide adequate mechanical integrity.

RIC polymers of the disclosure can generally be produced from monomers including a fluorinated ethylenically unsaturated monomer and a non-fluorinated ethylenically unsaturated monomer including an acid labile protecting group. In some embodiments, RIC polymers of the disclosure are produced from a monomeric mixture including a fluorinated ethylenically unsaturated monomer, and a non-fluorinated ethylenically unsaturated monomer, such as a styrenic sulfide including an acid labile protecting group. A photoacid generator can also be added to the mixture prior to polymerization to form a RIC polymer core.

As used herein, the term "fluorinated ethylenically unsaturated monomer" refers to a compound that includes at least one carbon-carbon double bond and one or more fluoride substituents. Exemplary fluorinated ethylenically unsaturated monomers that can be used to produce RIC polymers of the disclosure include, but are not limited to, a fluorinated methacrylate, a fluorinated acrylate, vinyl fluoride, fluorostyrene, fluorinated norbornene, fluorinated cyclic esters, fluorinated cyclic amides, fluorinated cyclic ethers, fluorinated vinyl ethers, fluorinated epoxides, fluorinated thiiranes, and a combination thereof. It should be appreciated that the fluorinated ethylenically unsaturated monomer in the monomeric mixture can be a mixture of two or more fluorinated ethylenically unsaturated monomers.

In one particular embodiment, the amount of fluorinated ethylenically unsaturated monomer present in the monomeric mixture ranges from about 10 mol % to about 90 mol %, typically from about 20 mol % to about 80 mol %, and often from about 30 mol % to about 70 mol % relative to the total amount of the monomeric mixture. However, it should be appreciated that the scope of the disclosure is not limited to this particular amount of fluorinated ethylenically unsaturated monomer.

The non-fluorinated ethylenically unsaturated monomer can be same as the fluorinated ethylenically unsaturated monomer but without any fluoride substituent. Accordingly, in one embodiment, the non-fluorinated ethylenically unsaturated monomer includes a methacrylate, an acrylate, optionally substituted ethylene, styrene, norbornene, cyclic esters, cyclic amides, and a combination thereof. As stated herein, the non-fluorinated ethylenically unsaturated monomer includes an acid labile group. Accordingly, the non-fluorinated ethylenically unsaturated monomer includes a hydroxyl (—OH) or a sulfide (—SH) group that is protected with an acid labile group. In one particular embodiment, the non-fluorinated ethylenically unsaturated monomer is a styrenic sulfide. Unless the context requires otherwise, the terms "styrenic sulfide including an acid labile protecting group" and "styrenic sulfide" are used interchangeably herein and refer to a compound of the formula:

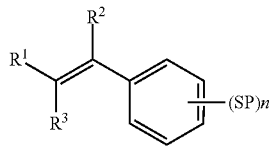

where each of $R^1$, $R^2$, and $R^3$ is independently H, $C_{1-20}$ (typically $C_{1-12}$, often $C_{1-6}$) alkyl, or a halide; n is an integer from 1 to 5, typically 1 to 3, and often 1; each P is independently H, or an acid labile protecting group, provided at least one of P is an acid labile protecting group. The term "acid labile protecting group" refers to a protecting group that is readily cleaved upon exposure to acid such as a carboxylic acid, sulfonic acid, hydrochloric acid, or other acids having pKa of about 10 or less. Typically, the acid protecting group is selected such that at least about 50%, often at least about 70%, and often at least about 80% of the acid labile protecting group is cleaved under the conditions disclosed herein. Suitable acid labile protecting groups are well known to one skilled in the art and can be found, for example, in P. G. M. Wuts, *Green's Protective Groups in Organic Synthesis*, $5^{th}$ edition, John Wiley & Sons, New York, 2014 (see also onlinelibrary.wiley.com/doi/book/10.1002/9781118905074), and *Compendium of Synthetic Organic Methods*, Vols. 1-13 (John Wiley and Sons, 1971-2014), which are incorporated herein by reference in their entirety. Representative acid labile protecting groups that are useful in the present disclosure include, but are not limited to, tert-butoxycarbonyl (i.e., t-BOC or BOC) and other t-butyl esters, tetrahydropyran, tetrahydrofuran, silyl ethers (e.g., trimethyl silyl ether, t-butyl dimethyl silyl ether, triisopropyl silyl ether, etc.), thioesters, thiocarbonyls, t-butyl ethers, t-butyl sulfides, and the like.

In one particular embodiment, the amount of non-fluorinated ethylenically unsaturated monomer including an acid labile protecting group present in the monomeric mixture ranges from about 90 mol % to about 10 mol %, typically from about 80 mol % to about 10 mol %, and often from about 70 mol % to about 10 mol % relative to the total amount of the monomeric mixture. However, it should be appreciated that the scope of the disclosure is not limited to these particular range of amounts. Moreover, non-fluorinated ethylenically unsaturated monomer in the monomeric mixture can be a mixture of two or more different non-fluorinated ethylenically unsaturated monomers. It should also be appreciated that the mol % is a relative amount based on the total amount of the fluorinated ethylenically unsaturated monomer and the non-fluorinated ethylenically unsaturated monomer in the mixture. Thus, the total will always be considered to be 100%.

RIC polymers can be prepared from the monomeric mixture using any of the polymerization methods known to one skilled in the art, such as free-radical reaction, free-radical atom transfer reaction, and any controlled radical polymerization methods, which include atom transfer radical polymerization (ATRP), reversible addition fragmentation chain transfer polymerization (RAFT), nitroxide mediated polymerization, and other controlled polymerizations, which include ring opening metathesis polymerization (ROMP). The refractive index (n) of the RIC polymers of the disclosure can be adjusted by varying the amount of the fluorinated ethylenically unsaturated monomer and the non-fluorinated ethylenically unsaturated monomer including an acid labile protecting group.

For the sake of brevity and clarity, the present disclosure will now be described with regard to the methods and compositions for RIC polymers that are produced from monomers including a fluorinated methacrylate and a styrenic sulfide including a t-BOC (or simply BOC) as an acid labile protecting group. However, the scope of the disclosure is not limited to polymers produced from these two monomers. Generally, RIC polymers of the disclosure can be a mixture of any fluorinated ethylenically unsaturated monomer and a non-fluorinated ethylenically unsaturated monomer including an acid labile protecting group, as long as the resulting polymers are within the desired refractive index range. This discussion using a fluorinated methacrylate and a styrenic sulfide including a BOC protecting group is provided solely for the purpose of illustrating the practice of the disclosure and does not constitute limitations on the scope thereof.

Figure 10:
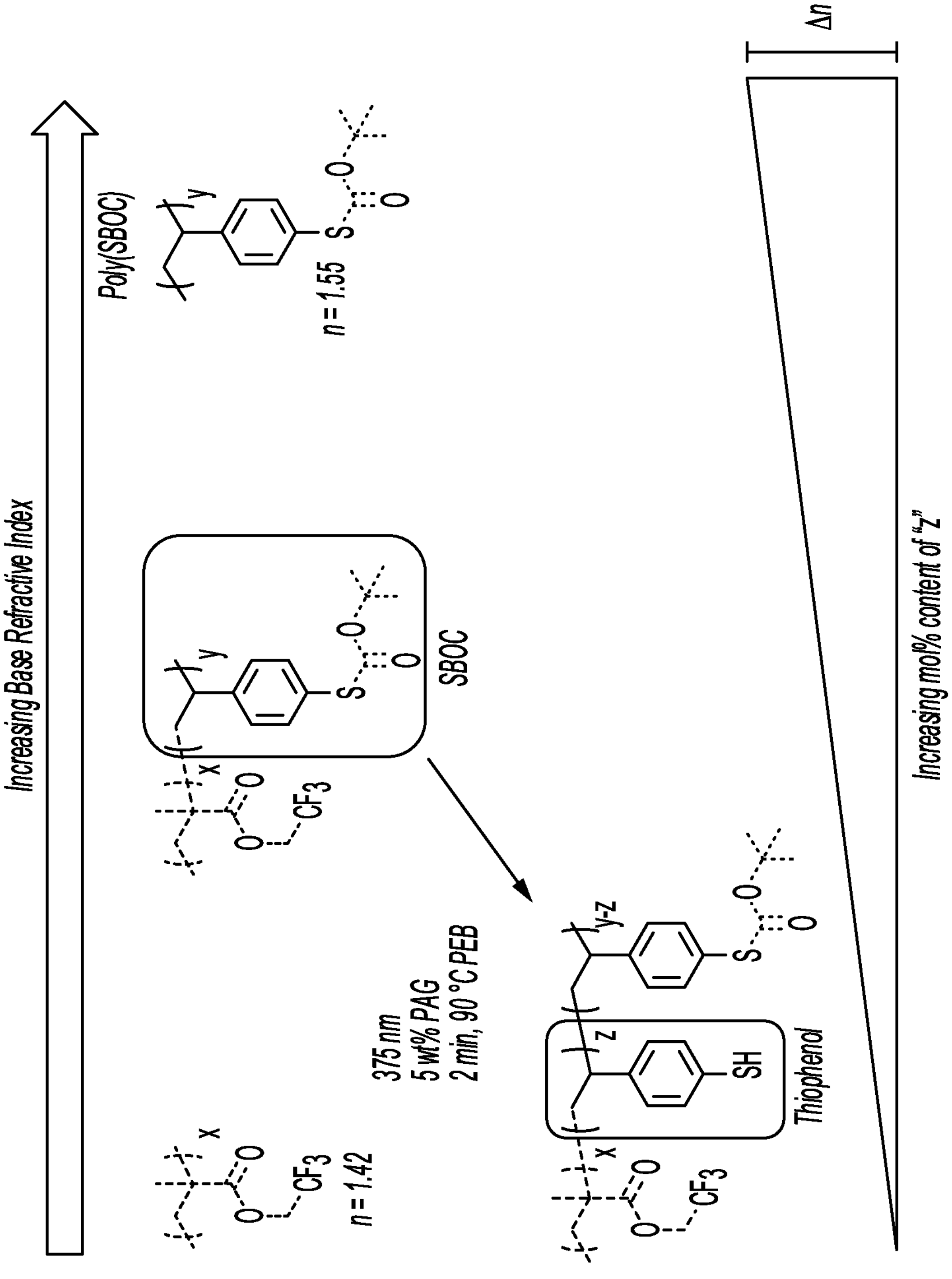
FIG. 10 illustrates monomers and the resulting RIC polymers, according to various embodiments.

In this regard, the monomers and the resulting RIC polymers along with the base refractive index of a polymer produced from a pure 2,2,2-trifluoroethylmethacrylate (n=1.42) and a polymer produced from a pure styrenic S-BOC (n=1.55) is shown in FIG. 10. As can be seen in FIG. 10, the base refractive index (n) gradually increases from n=1.42 to 1.55 as the amount of styrenic S-BOC increases from 0% to 100%. In general, one can achieve a desired refractive index of the resulting polymer by modifying the amount of a fluorinated ethylenically unsaturated monomer and the amount of a non-fluorinated ethylenically unsaturated monomer. The base refractive index can be tunable. The magnitude of $\Delta n$ can be determined by the relative content of SBOC and consequently thiophenol moieties.

Again referring to FIG. 10, combining the mixture of monomers for producing RIC polymer of the disclosure with a photoacid generator (PAG) and exposing the resulting RIC polymer with light (e.g., 375 nm) generates acid in situ and results in removal of the acid labile protecting group. Post exposure baking (PEB) of the resist film for 2 min. at 90° C. prevents further removal of acid labile protecting group. As the amount of thiophenol increases relative to the SBOC portion, the refractive index of the resulting (i.e., photoexposed) portion of the polymer increases. Thus, the magnitude of refractive index increase (i.e., $\Delta n$) can be readily controlled by the amount of acid labile protecting group removal. As schematically illustrated in FIG. 10, as the amount of acid labile protecting group removal is increased, the difference in the refractive index from the base (i.e., RIC polymer core) refractive index is increased. In particular, the base refractive index can be adjusted by varying the amount of the fluorinate methacrylate monomer and the styrenic sulfide. In addition, one can adjust the refractive index of the "grayscale taper" by removing the acid labile protected polymer.

Figure 11:
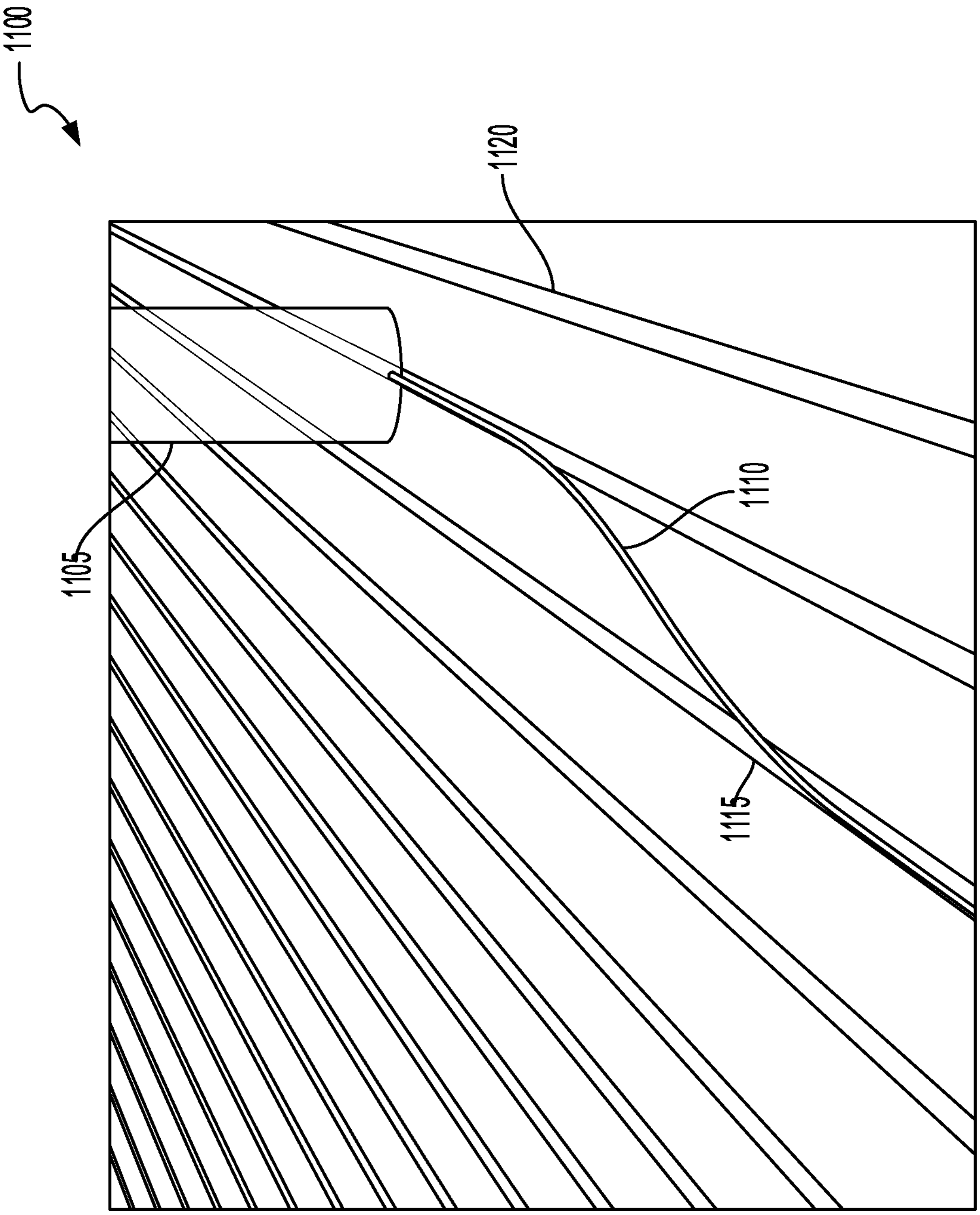
FIG. 11 illustrates a direct laser writing system, according to various embodiments.

This discovery to achieve a desired base refractive index of the polymer and increasing the change in the refractive index by removing a protecting group allows adjustment of refractive index (RI) in solution cast thin films with precise spatial control. The ability to create refractive index contrast (i.e., a difference in RI between two domains) is one of the requirements for the fabrication of integrated photonics devices, such as, polymer waveguides and interconnects between waveguides. The different RI domains of RIC polymers of the disclosure can be photopatterned with or without a mask or using a direct laser writing system thus creating regions of high RIC. FIG. 11 illustrates a direct laser writing system 1100. Some embodiments of the disclosure create a high RI waveguide core in a single step thereby allowing rapid fabrication of photonic devices via direct laser writing. Waveguides made from RIC polymers of the disclosure have very low propagation losses, typically about 2 dB/cm or less, often about 1.5 dB/cm or less, and more often about 1 dB/cm or less at 1550 nm. In other embodiments, waveguides made from RIC polymers were found to have propagation losses of about 1.25 dB/cm or less, typically about 0.75 dB/cm or less, and often about 0.4 dB/cm or less at 1310 nm. The direct laser writing system 1100 can include a maskless lithography for direct-write 1105, an SBOC polymer optical exposure-induced waveguide 1110, a grayscale optical exposure-induced index taper 1115, and an ion-exchanged waveguide in glass laminate 1120.

As can be seen, some aspects of the disclosure provide a new class of photoresponsive, polymer photoresists where the refractive index of the polymer can be adjusted via UV irradiation to facilitate the arbitrary writing of optical waveguides and other photonic devices in the material. The copolymer can be spin-coated onto to any substrate or existing photonic device architecture and, through lithography, resulting in direct coupling of individual waveguides, functioning as an inexpensive optical interconnect medium. The ability to transfer an optical signal between waveguide devices is critical in the formation of optical printed circuit boards, which can provide much higher bandwidth and lower power consumption than traditional electrical printed circuit boards.

The present disclosure, thus generally described, will be understood more readily by reference to the following examples, which are provided by way of illustration and are not intended to be limiting of the present disclosure.

The ability to create refractive index contrast (i.e., a difference in RI between two domains) is critical for the fabrication of integrated photonics devices, such as, polymer waveguides. Refractive index contrast polymers in the presence of a photoacid generator (PAG) were fabricated and photopatterned. Exposure to UV resulted in a permanent increase of RI in the exposed regions, thus creating regions of high RIC. RIC materials are essentially photoresist-based polymers, however after photo-exposure of selected regions of deposited thin films, spatially defined regions of higher RI and RI contrast are directly fabricated for optical waveguiding in the dry film, which is a significant advance over state-of-the-art waveguide fabrication processes that generally rely on the use of various wet or dry etching steps.

Figure 12:
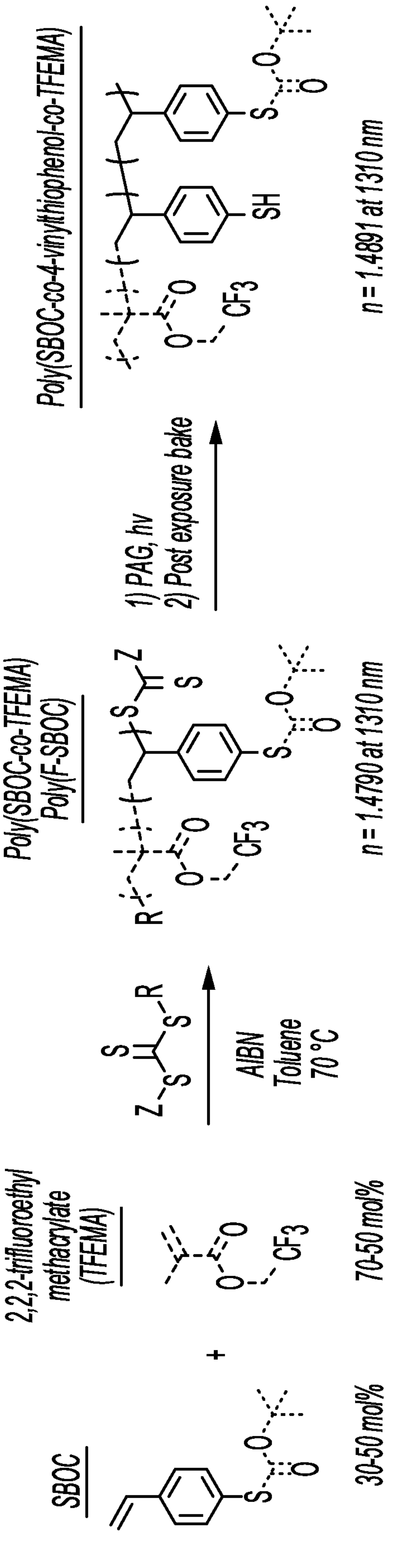
FIG. 12 illustrates a synthetic scheme for the preparation of an F-SBOC polymer, according to various embodiments.

Polymers of vinylthiophenol t-BOC protected monomer (SBOC) and polySBOC (n=1.5427) that upon photoinduced deprotection become poly(vinylthiophenol) (i.e., removal of t-BOC group) provided an increase in RI (n=1.5830). However, for use as a thin film optical interconnect, there is a need to tune the base RI of the RIC polymeric material to tailor optical coupling to specific waveguide platforms, such as IOX. An attractive feature of this system is the ability to tune the base RI of the material via copolymerization of the styrenic SBOC monomer with other vinylic (meth)acrylate comonomers. In this case, the ability to lower the base RI of the RIC polymeric material was developed using copolymerization of SBOC with 2,2,2-trifluoroethyl methacrylate, enabling tuning of the RI within the RI window of n=1.42 to 1.56, since these are the RI values of the poly(TFEA) and poly(SBOC) homopolymer, respectively. FIG. 12 illustrates a synthetic scheme for the preparation of an F-SBOC polymer. To enable application of these fluorinated RIC copolymers as optical interconnects for IOX waveguides, the RI of the base, deprotected copolymer of poly(SBOC-random-TFEA), called poly(F-SBOC), was targeted to be n≥1.48 prior to photolithography. These copolymers were readily prepared via the free radical polymerization of SBOC and TFEA using reversible addition-fragmentation chain transfer (RAFT) polymerization agents, which afforded soluble, solution processable copolymers.

In a typical run, two compositions of poly(F-SBOC) were prepared with either 50 or 30 mol % SBOC feed ratios relative to 2,2,2-trifluoroethyl methacrylate, where an overall degree of polymerization of 200 was targeted. The experimental procedure for a 50 mol % loading of SBOC was as follows. A 25 mL Schlenk flask equipped with a magnetic stir bar was charged with SBOC (6.25 g, 26.50 mmol) and 2,2,2-trifluoroethyl methacrylate (3.77 mL, 26.50 mmol). Separately, in a 20 mL vial, the RAFT chain transfer agent (CTA) 2-cyano-2-propyl dodecyl trithiocarbonate (36.55 mg, 0.1059 mmol) and 2,2'-azobis(2-methylpropionitrile) (8.7 mg, 0.0530 mmol) were dissolved in toluene (8.5 mL) then added to the Schlenk flask. The flask was sealed with a rubber septum and the solution was degassed by bubbling argon gas through the mixture for 10 minutes. The reaction vessel was placed in a 70° C. thermostatted oil bath and this temperature was maintained with stirring for 24 hours. The reaction was quenched by exposure to air and diluted with chloroform after an aliquot had been removed to calculate conversion. The poly(F-SBOC) was precipitated by addition to a large excess of chilled methanol and the off white/yellow powder collected via vacuum filtration and dried under vacuum. This general procedure was used to synthesize the various compositions investigated.

The copolymer with a 30 mol % feed ratio of SBOC was found to have a molecular weight of $M_n$=54,788 g/mol, $M_w/M_n$=1.917 and a refractive index of n=1.4769 at 1310 nm. The copolymer with a 50 wt % feed ratio of SBOC was found to have a molecular weight of $M_n$=64,930 g/mol, $M_w/M_n$=1.627 and a n=1.5033 at 1310 nm. In a clean room, the dried poly(F-SBOC) was dissolved in a 1:9 mixture of 1,1,1,3,3,3-hexafluoro-2-propanol:propylene glycol monomethyl ether acetate to afford a 40 wt/v % solution. To this solution was added the photoacid generator (4-phenylthiophenyl)diphenylsulfonium triflate at 5 wt/wt % relative to the amount of poly(F-SBOC). This procedure was repeated for the poly(F-SBOC) prepared with a lower mol % of SBOC units and a solution in 1,1,1,3,3,3-hexafluoro-2-propanol/propylene glycol monomethyl ether acetate prepared with the same relative loading of photoacid generator. The solutions were titrated together until the desired refractive index was achieved.

The glass thickness for this experiment was 0.7 mm and the refractive index of the base glass was 1.4808 at a wavelength of 1310 nm. The waveguide index contrast is ~0.0047 and the waveguide is located directly underneath the glass surface. After singulation, the IOX waveguide substrates had a size of 2.5 cm×2.4 cm, each containing 32 waveguides that were single-mode at 1310 nm. Each chip was separated into two waveguide groups, each containing 16 waveguides spaced 250 μm apart center-to-center. The insertion loss at 1310 nm wavelength of 22 waveguide arrays (~350 waveguides) was evaluated, with a mean fiber-to-fiber insertion loss of 0.89 dB±0.13 dB, which includes fiber coupling loss at both end-faces and waveguide propagation loss for a length of 2.5 cm.

An interconnect element is of practical importance for the realization of an OPCB as an efficient coupler between a polymer optical interconnect, in this case implemented in poly(F-SBOC) waveguides, and the OPCB, which was realized in IOX glass waveguides. Simulations were used to guide the design of coupling between poly(F-SBOC). Models of the poly(F-SBOC) waveguides on the IOX glass waveguides were developed to determine the required polymer dimensions to ensure adiabatic coupling and single-mode propagation; air was used as the top cladding, enabling the use of thinner poly(F-SBOC) films. FIMMWAVE simulations were used to determine the required polymer thickness (>5 μm) in the unexposed regions for the mode to fully transition from the IOX waveguide to the poly(F-SBOC) waveguide. Poly(F-SBOC) waveguide widths between 3 μm and 5 μm were selected to meet these requirements as well as to be consistent with the resolution of the Heidelberg MLA 150 (maskless aligner) photopatterning tool.

The unique dry-film refractive index contrast benefit of the poly(F-SBOC) allows for the realization of single-mode taper structures based entirely on direct grayscale lithography of a planar film, with no physical material removal required. The grayscale taper design used was based on a less fluorinated (higher index) formulation of poly(F-SBOC) along with a slightly higher index top cladding. Further simulations and fabrication iterations were used to arrive at the optimal parameters for the poly(F-SBOC) system. The fabricated grayscale taper was split into 16 equal sized areas depending on the length of the taper (125 μm sections for a 2 mm long taper or 62.5 μm sections for a 1 mm long taper). The 16 sections approach was chosen to ensure maximum coupling efficiency and match the 8-bit grayscale feature of the lithography tool. The dose pattern was based on the observation that the maximum index change of the SBOC homopolymer occurred for an exposure of 2000 mJ/cm$^2$ at 375 nm wavelength. The lowest dose taper section received 50 mJ/cm$^2$ with a linear increase of dose up to the maximum of 2000 mJ/cm$^2$, resulting in a refractive index ranging from 1.479 up to 1.491.

The test structures were designed to couple light out of an IOX waveguide and then couple that light into an adjacent IOX waveguide. By comparing the light left in the initial IOX waveguide with that in the destination IOX waveguide together with a separate estimate of the propagation loss in the poly(F-SBOC) waveguides, the losses from the grayscale taper couplers can be estimated as long as S-bend loss is negligible. A sinusoidal S-bend design was adopted for the poly(F-SBOC) interconnects that were used to optically couple between IOX waveguides. The radius of the sinusoidal interconnect features was calculated based on the length and width of the S-bend. The S-bend width was taken as 250 μm to match the spacing of the waveguides on the IOX waveguide array. The required length was estimated, and a radius calculated using a MATLAB script. This radius was used in a FIMMWAVE simulation of poly(F-SBOC) on IOX to estimate an attenuation coefficient for the bend. This value was multiplied by the total length and then converted to dB to estimate the total loss of the bend. Bends were designed to have <0.001 dB of loss for $TE_0$ and $TM_0$ modes. For 5 μm wide waveguides, the s-bend was 9 mm long, with corresponding lengths of 14 mm and 17 mm for 4 μm and 3 μm wide waveguides, respectively. There were straight portions of the waveguide connecting the taper to the S-bend for 4 μm and 5 μm wide waveguides, such that they started and ended 2.5 mm from each end of the IOX waveguide substrate.

Figure 13:
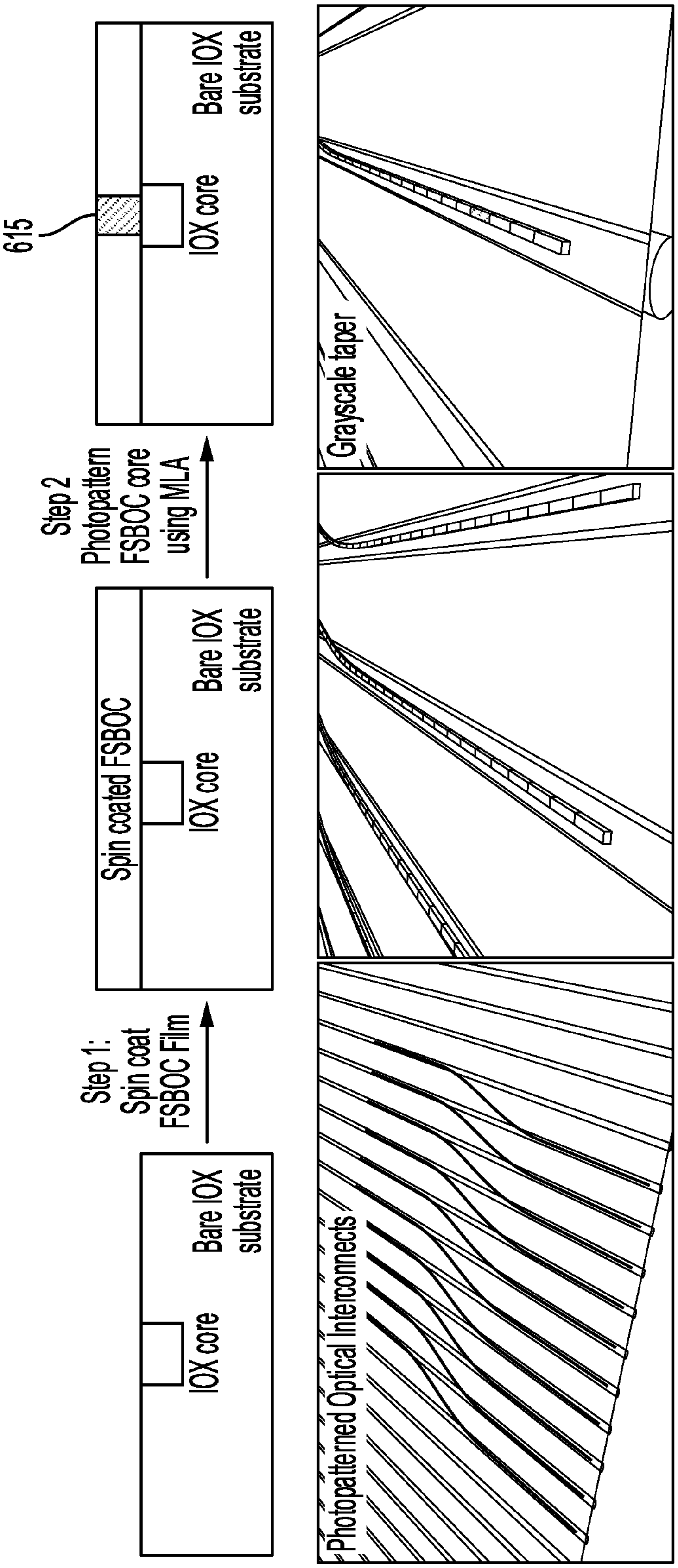
FIG. 13 illustrates a schematic showing two-step, "dry film" waveguide fabrication process for poly(FSBOC) s-bends with grey-scale tapers on-top of IOX glass waveguides, according to various embodiments.

Fabrication of poly(F-SBOC) tapers and interconnects was performed using standard tools common to the creation of silicon photonic devices and without the need for dry or wet etching steps following photopatterning. With only three major fabrication steps, the ease of this process allowed for rapid device creation and testing, as well as ensuring manufacturability for a wide range of applications. The fabrication of S-bend interconnects and tapers was conducted by sequential spin coating and photopatterning of poly(F-SBOC) films. FIG. 13 illustrates a schematic showing two-step, "dry film" waveguide fabrication process for poly (FSBOC) s-bends with grey-scale tapers on-top of IOX glass waveguides. The fabrication started by cleaning the IOX waveguide chip by suspending it in acetone and sonicating for 5 minutes, followed by sonication in isopropyl alcohol for another 5 minutes immediately after, then blown dry with $N_2$. Poly(F-SBOC) was applied onto the glass via spin coating to create a 5 μm thick film. This film was baked at 90° C. for 2 minutes after spinning to remove excess solvent. Once dry, the film was lithographically patterned, then a post exposure bake was performed at 90° C. for 2 minutes to complete the polymer waveguide fabrication. The poly(F-SBOC) grayscale tapers and waveguides were patterned in the Heidelberg MLA 150. The tapers consist of 16 different rectangular regions depending on the length of the taper (125 μm for a 2 mm taper, 62.5 μm for a 1 mm taper) as described above. Each region was patterned on a separate MLA layer to facilitate an increase of dosage in each segment which corresponds to an increase in refractive index as well. The straight waveguide and S-bend sections connecting the tapers were fabricated at the highest dose, so as to have the highest index contrast in the region where the mode propagates between IOX waveguides. The lowest dose, occurring on the first step of the taper, was 50 $mJ/cm^2$ with a linear increase of dose up to the maximum of 2000 $mJ/cm^2$. During patterning, each layer was situated such that the change in rotation between segments differs by $<0.005$ radians to ensure proper alignment.

Figure 14:
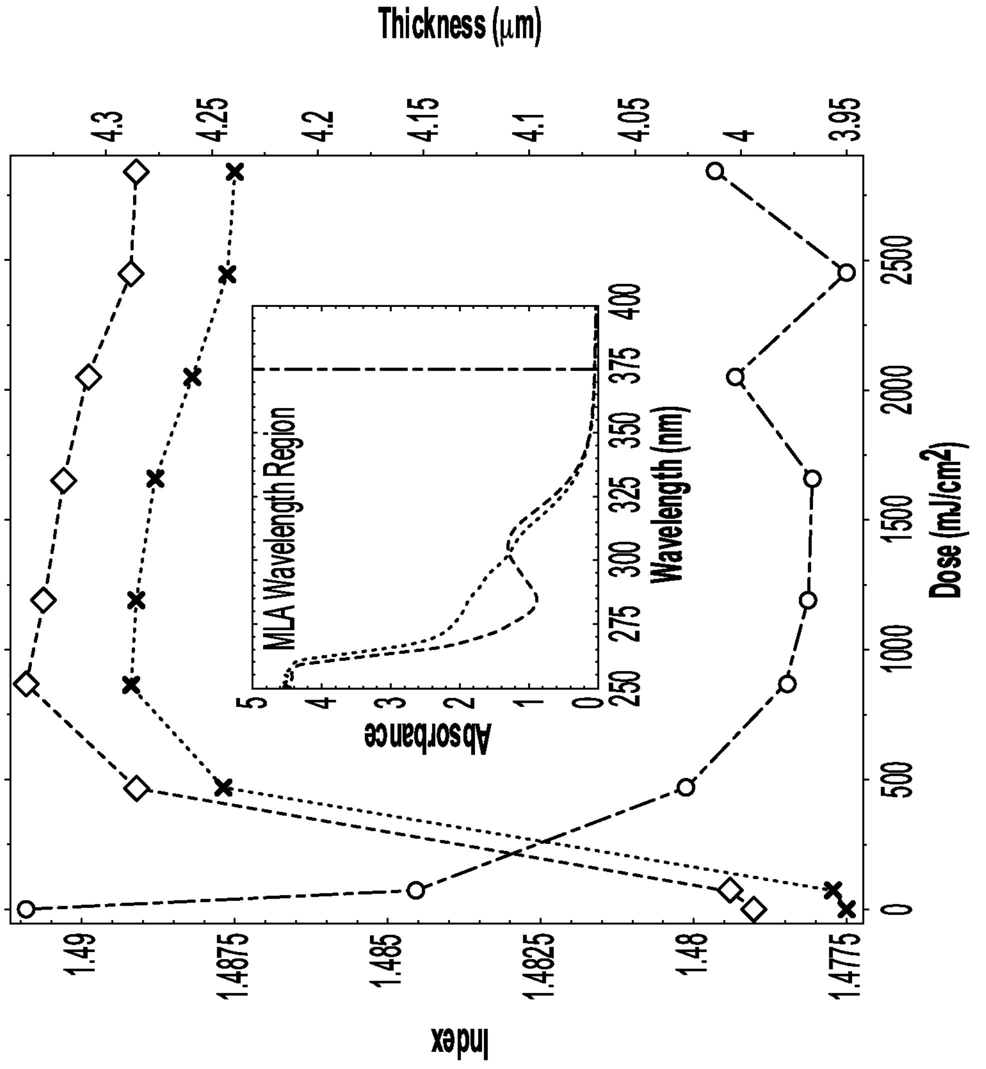
FIG. 14 illustrates a plot of refractive index and thickness of poly(F-SBOC) at varying fluence levels, according to various embodiments.

IOX waveguide substrates were characterized prior to poly(F-SBOC) waveguide fabrication to determine insertion loss associated with the glass waveguides themselves. The transmission of each waveguide on the chip was measured using a SMF28 fiber-to-fiber power measurement at 1310 nm with index matching oil at the fiber-waveguide interfaces. Polarization was generally adjusted to be transverse electric (TE); polarization dependent loss lower than 0.1 dB was observed. The refractive index of the poly(F-SBOC) at various exposure doses was measured on a Metricon 2010/M Prism Coupler. A layer of poly(F-SBOC) was spin coated onto a silicon substrate, targeting an initial thickness identical to that on the IOX waveguide substrate. 15 mm×15 mm sections were exposed at different dose levels corresponding to the doses used when fabricating the tapers and waveguide devices. These regions were used to measure the relationship between dose and index of the poly(F-SBOC). The reflection of 375 nm MLA laser radiation from the silicon was corrected using the calculated reflection coefficients of both poly(F-SBOC) and silicon; as the film thickness was ~15 times larger than the wavelength, thin film interference effects were ignored. Index measurements were performed at both 1305 nm and 1540 nm. FIG. 14 illustrates a plot of refractive index and thickness of poly(F-SBOC) at varying fluence levels. As shown in FIG. 14, the refractive index exhibited a gradual increase following an increase in exposure dose. Additionally, as the refractive index increased there was also a measurable decrease in thickness; thickness measurements were performed on a Dektak surface profilometer.

Figure 15:
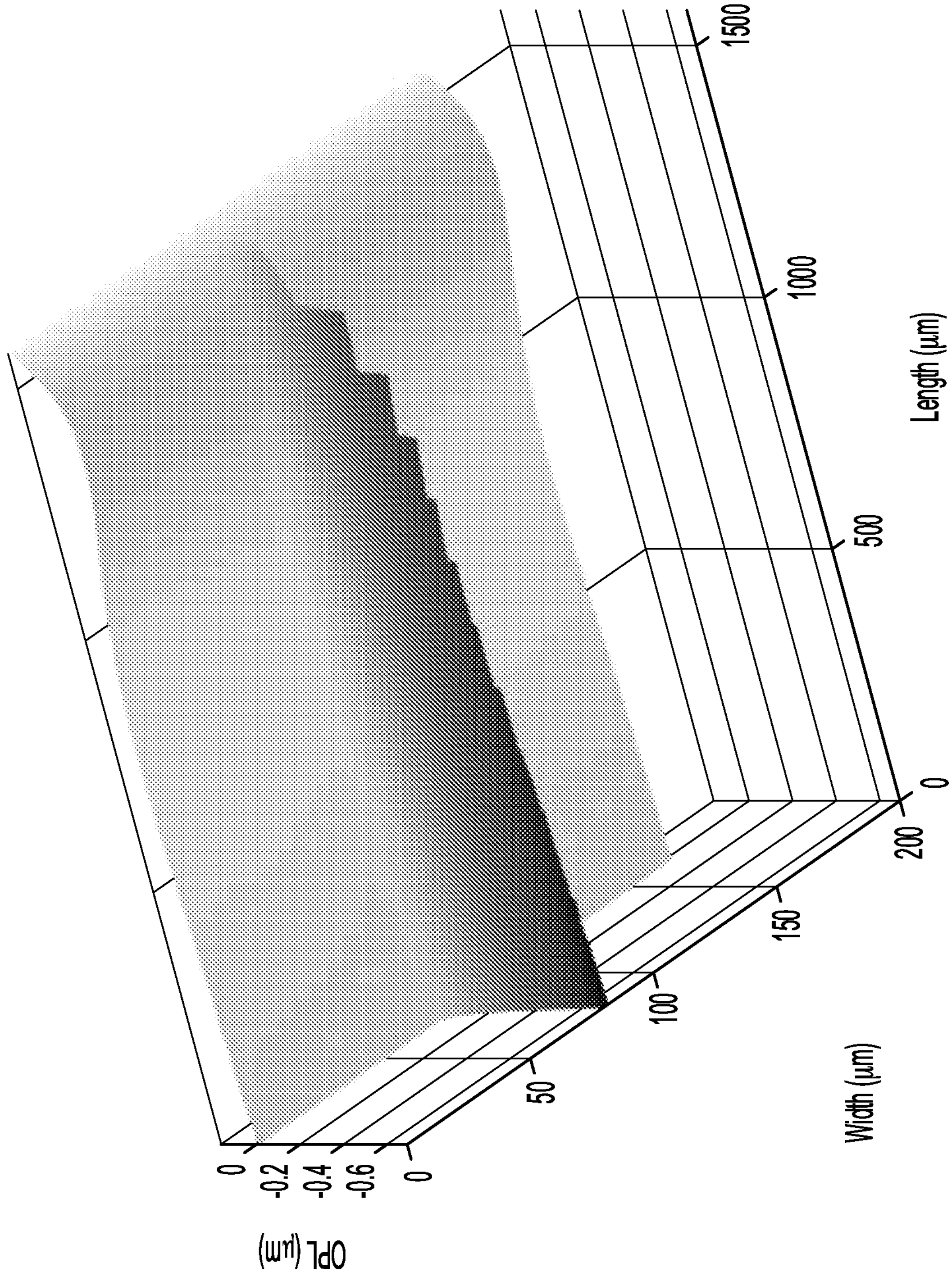
FIG. 15 illustrates a white light interferometry image of a fabricated poly(F-SBOC) taper, according to various embodiments.

The absorbance of poly(F-SBOC) was measured on a CARY UV-VIS spectrophotometer. Two samples were prepared on quartz glass slides, one as spun and one thermally deprotected by baking at 200° C. for 10 minutes. The absorbance plot (FIG. 14 inset) showed the polymer itself did not significantly absorb the MLA wavelength radiation ensuring that the exposure occurred throughout the volume of the polymer when a suitable concentration of photoacid generator compound was present. White light interferometry pictures of fabricated tapers and waveguides were taken on a Zygo NewView 9000 and results are shown in FIG. 15. FIG. 15 illustrates a white light interferometry image of a fabricated poly(F-SBOC) taper. OPL is optical path length as both refractive index changes and thickness changes occur during the process. These images showed the approximate dimensions of the devices and showed that the design dimensions were successfully achieved with the MLA-based fabrication process.

Figure 16A:
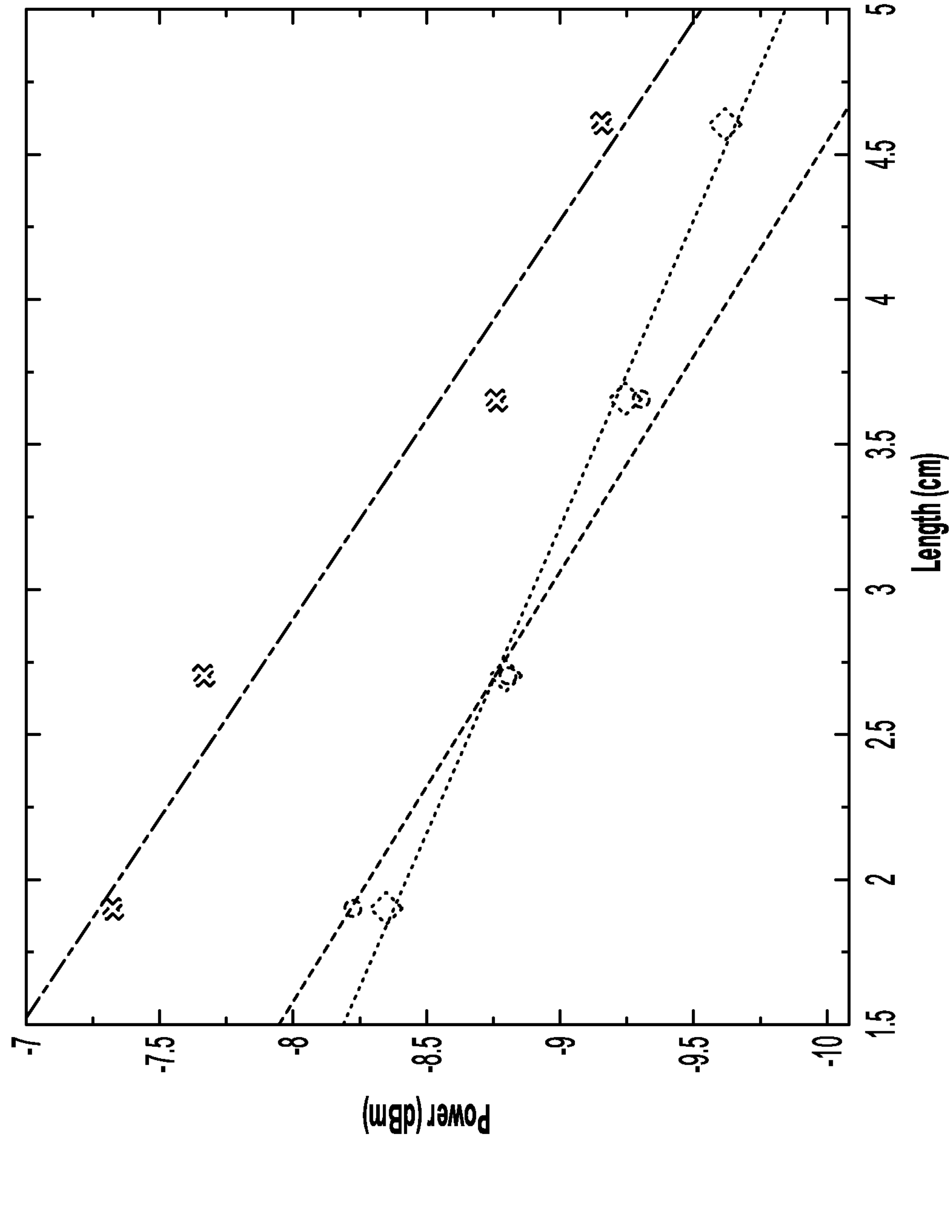
FIG. 16A illustrates a plot of the cutback measurements of poly(F-SBOC) waveguide propagation loss at 1310 nm, according to various embodiments.
Figure 16B:
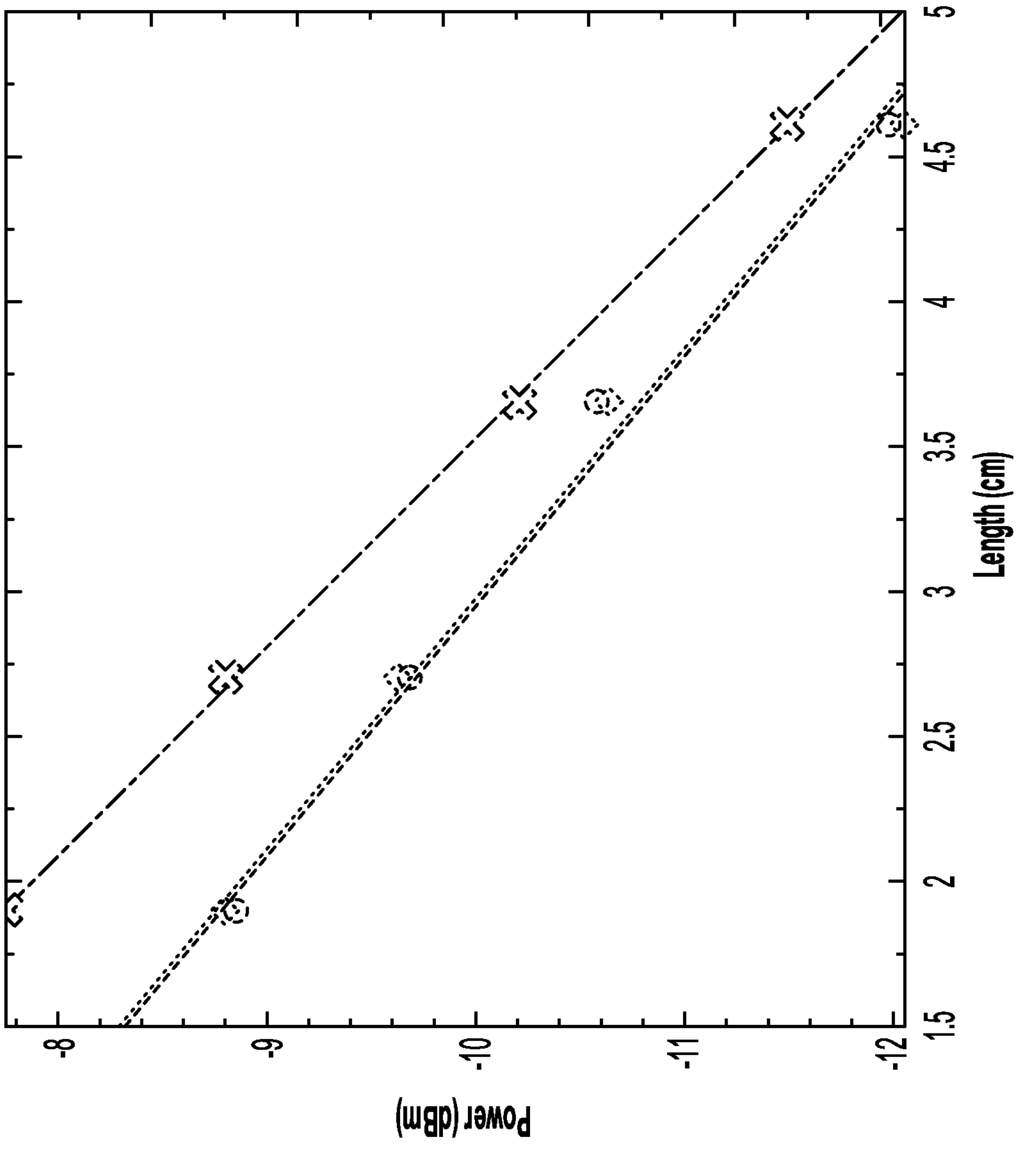
FIG. 16B illustrates a plot of the cutback measurements of poly(F-SBOC) waveguide propagation loss at 1550 nm, according to various embodiments.

Propagation loss for poly(F-SBOC) was measured using the cutback method. Samples for cutback were prepared by spinning F-SBOC onto 6 μm of $SiO_2$ on Si with a target thickness of 5 μm to approximately match what was fabricated on IOX waveguide substrate and exposed at 2000 $mJ/cm^2$. A single-mode SMF-28 fiber was butt-coupled to a cleaved end facet of the sample to launch light into the polymer waveguides. A lens was used to capture the light emerging from the polymer waveguide at the other end of the sample, which was directed to a power meter; samples were cleaved to achieve an adequate range of waveguide lengths to determine the propagation loss for waveguides of 3 μm, 4 μm, and 5 μm width. FIG. 16A illustrates a plot of the cutback measurements of poly(F-SBOC) waveguide propagation loss at 1310 nm. FIG. 16B illustrates a plot of the cutback measurements of poly(F-SBOC) waveguide propagation loss at 1550 nm. The circles correspond to 3 μm wide waveguides, the squares to 4 μm wide, and crosses to 5 μm wide guides at 1310 nm for FIG. 16A and 1550 nm for FIG. 16B. At 1310 nm, the propagation loss for 3 μm wide waveguides was 0.67 dB/cm, while for 4 μm wide it was 0.47 dB/cm, and 5 μm wide gave 0.69 dB/cm. At 1550 nm the corresponding propagation loss values are 1.14 dB/cm at 3 μm width, 1.19 dB/cm at 4 μm, and 1.39 dB/cm at 5 μm. The propagation loss is lower at 1310 nm due to the reduced absorption contribution from molecular vibration absorption. The measured loss values are comparable to those of commercially available partially fluorinated polymer waveguide materials.

Figure 17A:
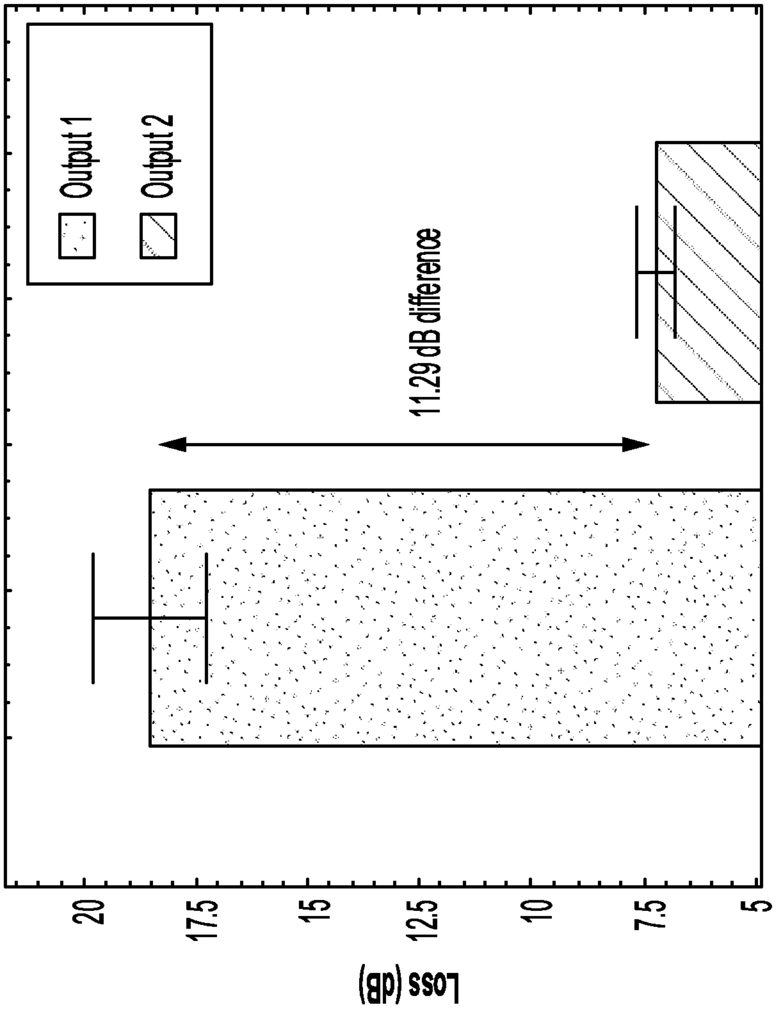
FIG. 17A illustrates a plot showing the insertion loss of poly(F-SBOC) waveguides and tapers on IOX glass at 1310 nm, according to various embodiments.
Figure 17B:
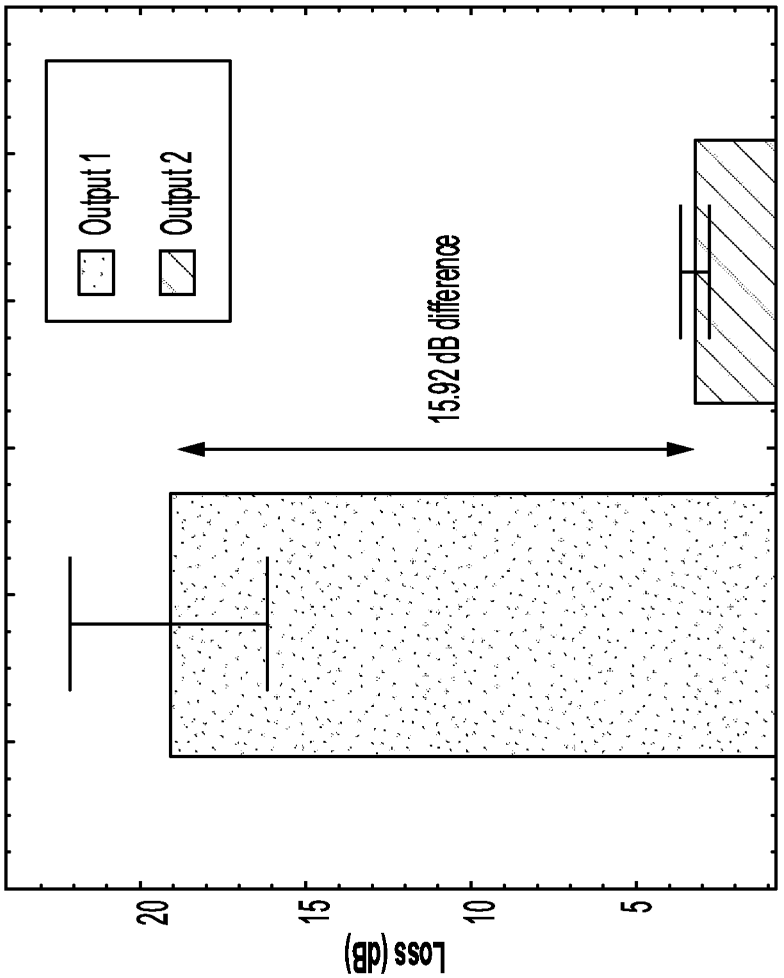
FIG. 17B illustrates a plot showing the insertion loss of poly(F-SBOC) waveguides and tapers on IOX glass at 1550 nm, according to various embodiments.

Multiple sources of loss were investigated to determine the effectiveness of the tapers to couple light out of and into IOX waveguides using our dry film lithography approach. Insertion loss measurements of tapers aligned to the center of the corresponding IOX waveguides provide a basic understanding of the capabilities for this demonstration. The insertion loss of the poly(F-SBOC) S-bend structures was determined by measuring 7 identical S-bends which had 3 μm wide waveguides and 2 mm long tapers. Fabricated waveguides and tapers on IOX waveguides were measured in a similar fashion as for the initial IOX waveguide characterization. Light was launched from a single-mode SMF-28 fiber into an IOX waveguide that had an input grayscale taper. The power was first optimized and measured at the end facet of the IOX waveguide that the light exits from after propagating through the S-bend and exit taper. The IOX waveguide that the light was originally launched into was then measured without adjusting the input fiber to ensure proper comparison between measured insertion losses. It was found that at 1310 nm, the loss from Output 1 (the launched IOX waveguide) was 18.53 dB±1.26 dB and the loss from Output 2 (destination IOX waveguide) was 7.24 dB±0.45 dB, with their difference being 11.29 dB±1.33 dB as shown in Table 1. For 1550 nm, the Output 1 loss was 19.14 dB±2.95 dB, and the Output 2 loss was 3.23 dB±0.45 dB with their difference being 15.92 dB±2.98 dB. The measured output powers were corrected for the input power background as well as the estimated propagation loss based on the cutback measurements; the resulting values were then averaged to get the values presented in FIGS. 17A and 17B. FIG. 17A illustrates a plot showing the insertion loss of poly(F-SBOC) waveguides and tapers on IOX glass at 1310 nm. FIG. 17B illustrates a plot showing the insertion loss of poly(F-SBOC) waveguides and tapers on IOX glass at 1550 nm. FIGS. 17A and 17B provide strong experimental evidence that the tapers work reproducibly and have low loss on the order of 1.6 dB at 1550 nm. The improved performance at 1550 nm is likely a result of the fact that the poly(F-SBOC) waveguides are slightly multimode at 1310 nm, which can result in additional loss due to mode coupling effects.

TABLE 1

Detailed loss budgeting of F-SBOC/IOX waveguide devices

| Source of Loss | 1310 nm | 1550 nm |
|---|---|---|
| Average Measured Power from Output 1 | −24.08 dBm | −26.86 dBm |
| Average Measured Power from Output 2 | −13.93 dBm | −12.88 dBm |
| Power from Output 1 pre-patterning | −5.55 dBm | −7.72 dBm |
| Propagation Loss over S-Bend | 1.139 dB | 1.938 dB |
| Calculated Loss of Output 1 | 18.53 dB | 19.14 dB |
| Calculated Total Taper Coupling Loss of Output 2 | 7.24 dB | 3.22 dB |
| Loss Per Taper | 3.62 dB | 1.61 dB |

Figure 18A:
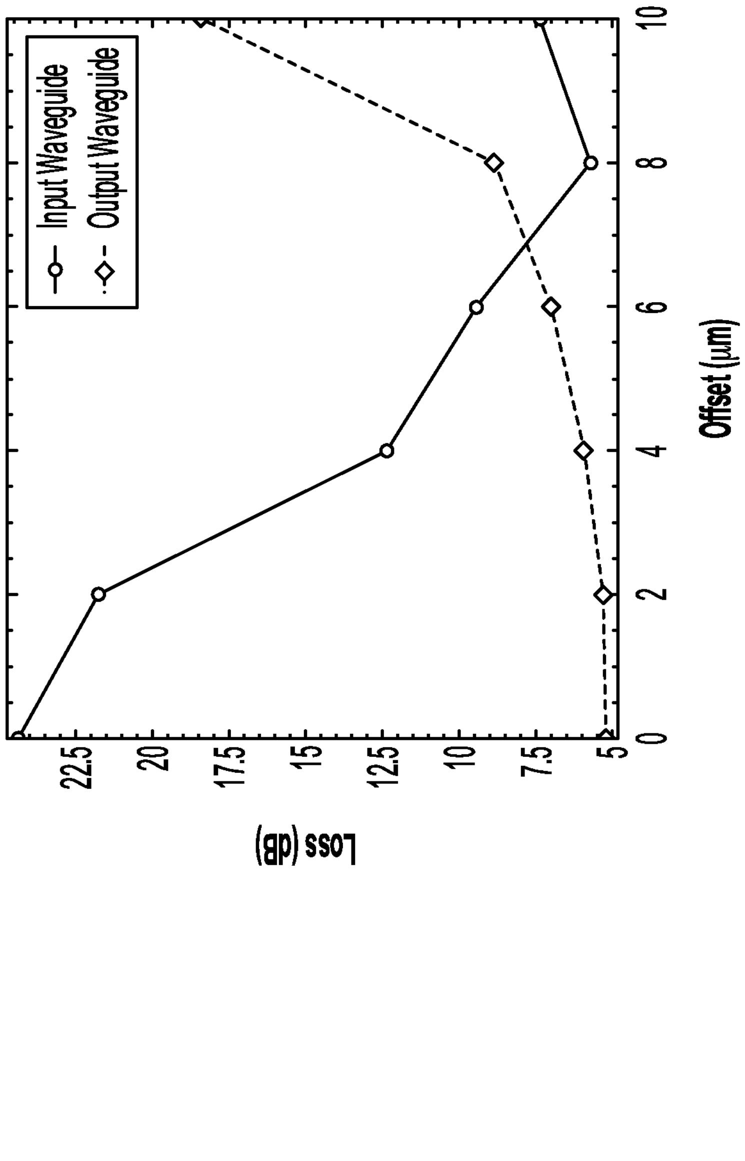
FIG. 18A illustrates a plot of the power measurement of poly(F-SBOC) tapers with offsets on IOX glass at 1310 nm, according to various embodiments.
Figure 18B:
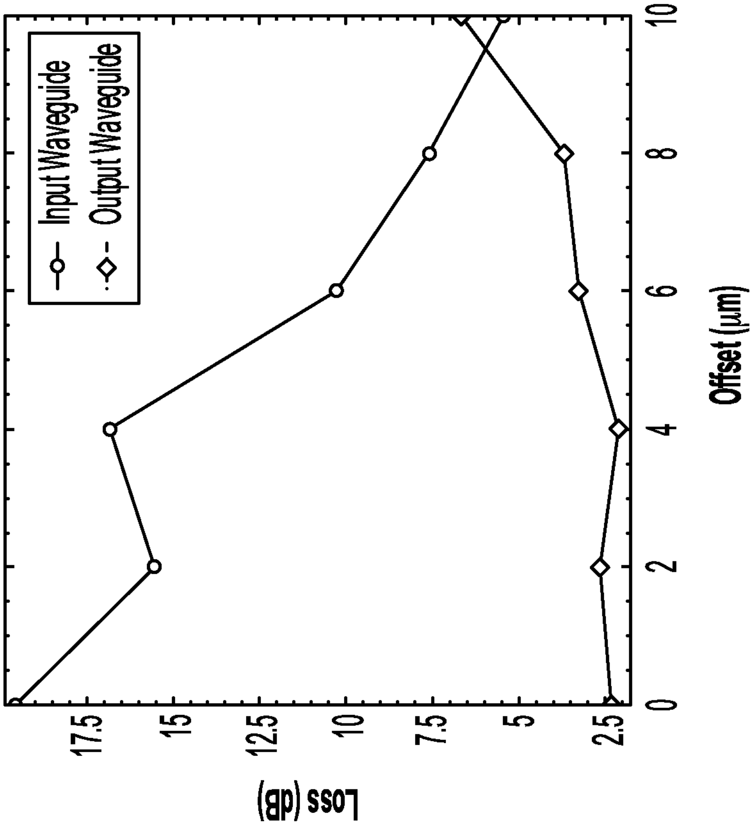
FIG. 18B illustrates a plot of the power measurement of poly(F-SBOC) tapers with offsets on IOX glass at 1550 nm, according to various embodiments.

Alignment offset tolerance was also explored to establish the required accuracy of taper placement, which effects the manufacturability of these interconnects. By having a larger alignment tolerance, common tools already used in photonic packaging, such as the Ficontec CL1500 pick-and-place system, can be used to readily adopt methods of the present disclosure. A series of tapers and S-bends with increasing offset from the center of the IOX waveguides were fabricated and measured to examine the alignment tolerance of the polymer waveguide devices. The waveguides are offset from a nominally perfect alignment in steps of 2 μm ranging from 0 μm to 10 μm. This offset occurred at the input end of the chip and the waveguide crossed roughly perpendicularly over the IOX launch waveguide in the S-bend. The output taper was aligned to the center of the destination IOX waveguide. All poly(F-SBOC) waveguides were 3 μm wide with 2 mm long tapers and 17 mm long s-bends. Similar to the insertion loss, the measured powers were corrected for input power background and the estimated propagation loss of the polymer; measurements were performed fiber-to-fiber (SMF-28) with index matching oil. A 1 dB decrease in efficiency occurred between 4 μm and 6 μm, indicating an alignment tolerance of ~5 μm as shown in FIGS. 18A and 18B. FIG. 18A illustrates a plot of the power measurement of poly(F-SBOC) tapers with offsets on IOX glass at 1310 nm. FIG. 18B illustrates a plot of the power measurement of poly(F-SBOC) tapers with offsets on IOX glass at 1550 nm. The circles are the output powers from the launched IOX waveguide and the diamonds are the output powers from the destination IOX waveguide at 1310 nm for FIG. 18A and at 1550 nm for FIG. 18B.

Figure 19A:
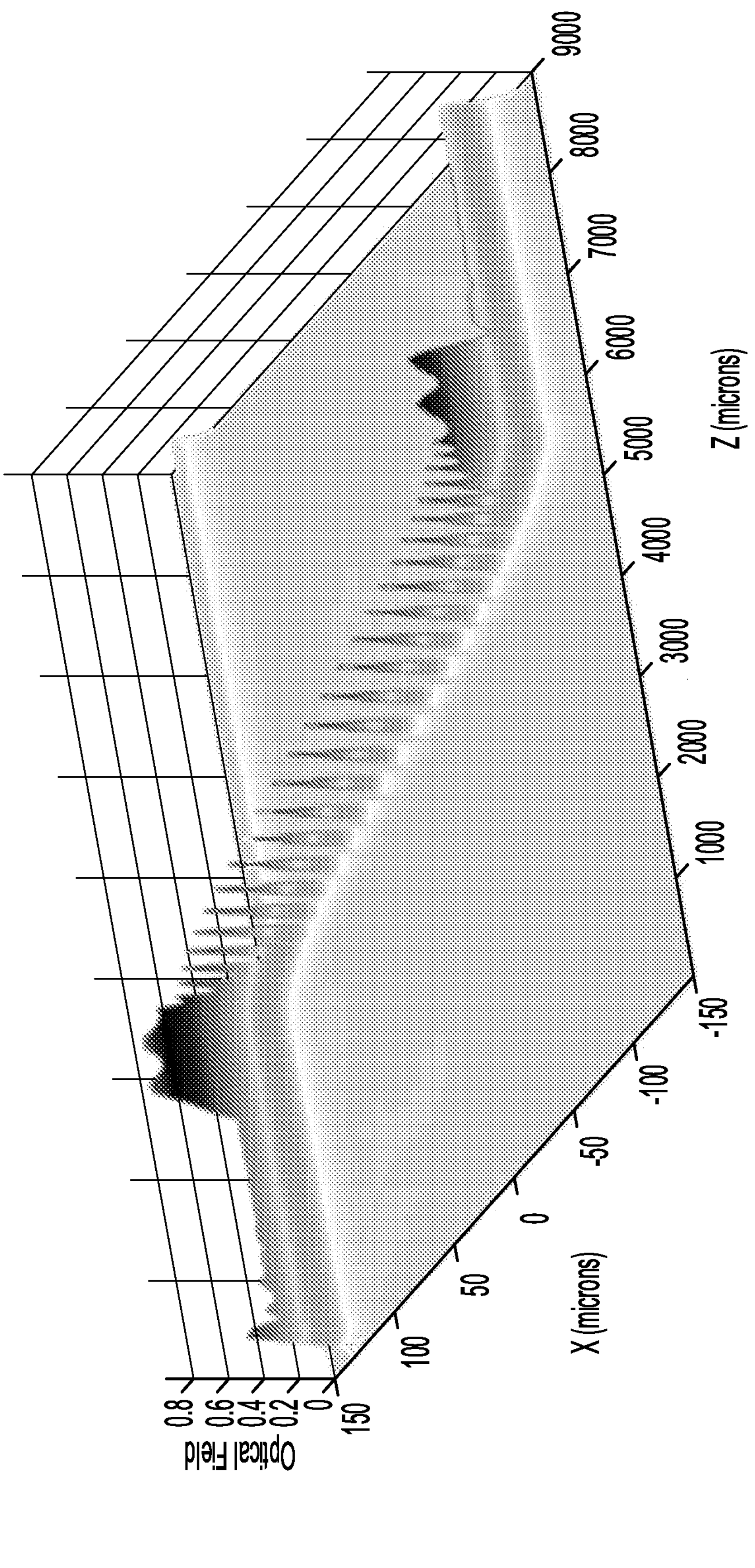
FIG. 19A illustrates an OptiBPM simulation of light propagation from one IOX waveguide chip to another through the use of an FS-BOC interconnect, according to various embodiments.
Figure 19B:
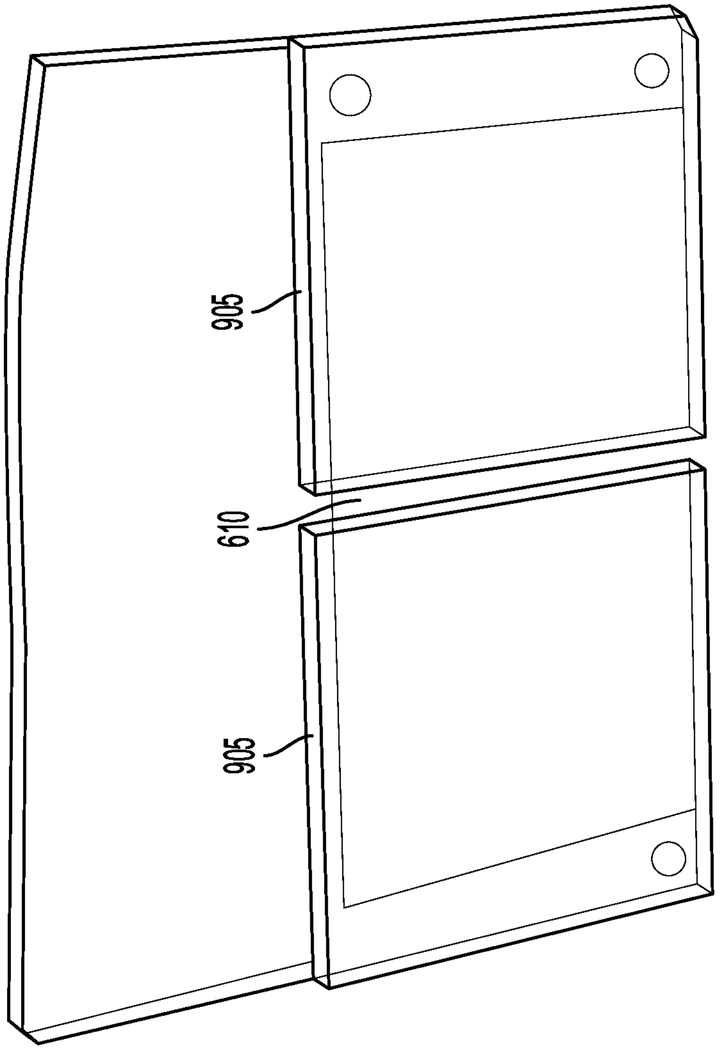
FIG. 19B illustrates a top view of fabricated IOX-to-IOX waveguide interconnect, according to various embodiments.
Figure 19C:
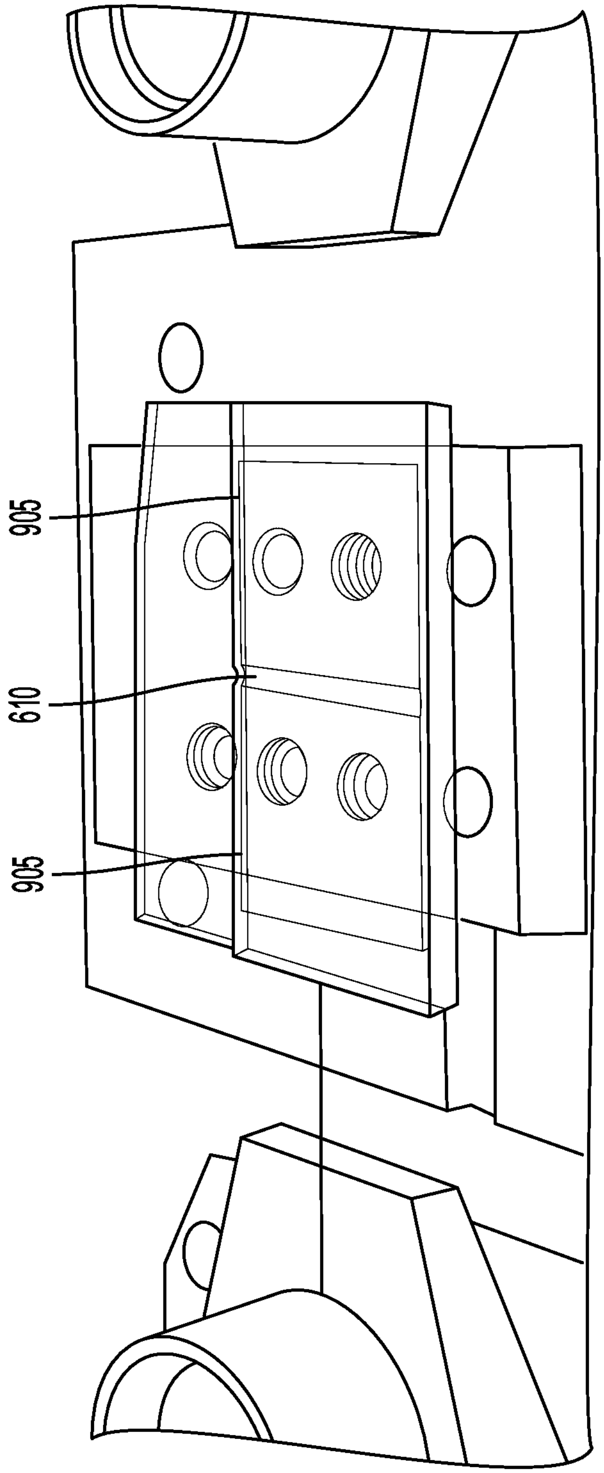
FIG. 19C illustrates a side view showing fibers coupled on the input and output sides of the two IOX waveguide chips, according to various embodiments.

To demonstrate the SmartPrint process, a flexible low refractive index polymer substrate (Tefzel®) was used for FS-BOC and we developed processes for bonding FS-BOC coated Tefzel to IOX glass waveguide arrays to demonstrate the SmartPrint capability by creating an optical interconnect between two separate IOX glass waveguide chips using the grayscale taper process. Consideration was given to the potential role of the large refractive index discontinuity at the end of the IOX glass waveguide chip and minimizing the impact through the use of potting compounds with suitable refractive indices. FIG. 19A shows the simulated propagation from IOX chip to IOX chip via the FS-BOC/Tefzel SmartPrint interconnect. FIG. 19A illustrates an OptiBPM simulation of light propagation from one IOX waveguide chip to another through the use of an FS-BOC interconnect. FIG. 19B illustrates a top view of fabricated IOX-to-IOX waveguide interconnect. FIG. 19C illustrates a side view showing fibers coupled on the input and output sides of the two IOX waveguide chips 905. The film 610 containing the fabricated interconnect is shown in FIG. 19B from the top and then in the setup for determining insertion loss in FIG. 19C. Fiber-to-fiber insertion losses as low as 5.6 dB were measured at 1310 nm, further confirming the low losses of the fabricated grayscale tapers.

One aspect of the present disclosure is directed to a method for producing an interconnect between a first waveguide and a second waveguide. The method includes coupling the interconnect with the first waveguide and coupling the interconnect with the second waveguide. The interconnect includes a substrate having a refractive index of the substrate. The interconnect includes a film including a RIC polymer. The film coats the substrate and includes a core. The core includes a first domain having a first refractive index. The core includes a second domain adjacent to the first domain and having a second refractive index. The second refractive index is less than the first refractive index. The core includes a third domain adjacent to the second domain and having a third refractive index. The third refractive index is less than the second refractive index. The method includes disposing the second domain between the first domain and the third domain. The refractive index of the substrate is less than the first refractive index, the second refractive index, and the third refractive index.

In some embodiments, the first refractive index, the second refractive index, and the third refractive index are in a range of about 1.40 to about 1.65. In some embodiments, the core includes a fourth domain adjacent to the third domain and having a fourth refractive index. The fourth refractive index is less than the third refractive index. The method includes disposing the third domain between the second domain and the fourth domain.

In some embodiments, the first waveguide and the second waveguide are misaligned. In some embodiments, the core is produced by at least one of a mask lithography system, a maskless lithography system, or a direct laser writing system.

In some embodiments, the RIC polymer is produced from a mixture including a fluorinated ethylenically unsaturated monomer, a non-fluorinated ethylenically unsaturated monomer including an acid labile protecting group, a photoacid generator. In some embodiments, the method includes photopatterning the RIC polymer to produce a photoexposed region and an unexposed region. The photoexposed region results in removal of the acid labile protecting group. The photoexposed region has a different refractive index compared to the unexposed region resulting in the photoexposed region defining the core.

In some embodiments, the substrate includes at least one of ethylene-tetrafluoroethylene (Tefzel™), polyvinyl alcohol, ethylene-vinyl alcohol, partially fluorinated acrylics, or perfluoropolyme. In some embodiments, the RIC polymer has average molecular weight in the range from about 1,000 g/mole to about 1,000,000 g/mole.

Refractive index contrast polymers were developed that are suited to a wide variety of photonic interconnect applications in the optical telecommunications windows, with refractive indices tunable over the wide range of n, e.g., n=1.42 to 1.56, and index contrast Δn precisely controlled by composition and ultraviolet exposure; waveguides are directly patterned in dry films with no wet or dry etching processes required. RIC polymer interconnects thus have the ability to access numerous photonic platforms, in particular silicon photonic chips and ion-exchange (IOX) glass optical substrates. For the first time, this disclosure provides compositions and methods for efficient single-mode polymer interconnect fabrication via a maskless lithography approach that exhibits low loss adiabatic coupling (e.g., ~1.5 dB at 1550 nm) to IOX waveguides through the formation of grayscale tapers. The present disclosure also provides "SmartPrint" polymer optical interconnect based on RIC polymers between two separate IOX glass waveguide chips.

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions, or biological systems, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed is:

1. A photonic device comprising:

a first waveguide and a second waveguide; and an interconnect coupled with the first waveguide and coupled with the second waveguide, the interconnect comprising:

a substrate having a refractive index of the substrate; and a film comprising a refractive index contrast (RIC) polymer, the film coating the substrate and comprising:

a core comprising:

a first domain having a first refractive index;

a second domain adjacent to the first domain and having a second refractive index, the second refractive index less than the first refractive index; and a third domain adjacent to the second domain and having a third refractive index, the third refractive index less than the second refractive index;

wherein the second domain is disposed between the first domain and the third domain; and wherein the refractive index of the substrate is less than the first refractive index, the second refractive index, and the third refractive index; and wherein the RIC polymer comprises a polymer produced from a monomeric mixture comprising from about 10% to about 90% of trifluoroethylmethacrylate and from about 90% to about 10% of a non-fluorinated ethylenically unsaturated monomer comprising an acid labile protecting group.

2. The photonic device of claim 1, wherein the first refractive index, the second refractive index, and the third refractive index are in a range of about 1.40 to about 1.65.

3. The photonic device of claim 1, wherein:

the core further comprises a fourth domain adjacent to the third domain and having a fourth refractive index, the fourth refractive index less than the third refractive index; and the third domain is disposed between the second domain and the fourth domain.

4. The photonic device of claim 1, wherein the substrate comprises at least one of ethylene-tetrafluoroethylene (Tefzel™), polyvinyl alcohol, ethylene-vinyl alcohol, partially fluorinated acrylics, or perfluoropolymer.

5. The photonic device of claim 1, wherein the first waveguide or the second waveguide comprises at least one of a silicon (SI) photonic chip, a silicon nitride (SN) photonic chip, an indium phosphide (IP) photonic chip, an ion-exchange (IOX) glass optical printed circuit board, a silica-on-silicon photonic circuit, a lithium niobate photonic circuit, an optical fiber array, or an optical fiber interconnect subassembly.

6. The photonic device of claim 1, wherein the acid labile protecting group comprises at least one of tert-butoxycarbonyl ("BOC"), a silyl ether, a t-butyl ester, tetrahydropyran (THP), tetrahydrofuran (THF), a thioester, a thiocarbonyl, tert-butyl ether, or t-butyl sulfide.

7. The photonic device of claim 1, wherein the RIC polymer has average molecular weight in the range from about 1,000 g/mole to about 1,000,000 g/mole.

8. The photonic device of claim 1, wherein the photonic device is at least one of an integrated splitter, a coupler, an arrayed waveguide grating, a modulator, a phase-shifter, a Mach-Zehnder interferometer, a directional coupler, a microring resonator, a mode converter, a grayscale adiabatic coupler, a laser, a detector, a tunable optical filter, a digital optical switch, a thermo-optic phase-shifter, or a variable optical attenuator.

9. The photonic device of claim 1, wherein the first waveguide and the second waveguide are misaligned.

10. The photonic device of claim 1, wherein the first waveguide and the second waveguide are misaligned by about 3 μm or more.

11. A method for producing an interconnect between a first waveguide and a second waveguide, the method comprising:

coupling the interconnect with the first waveguide and coupling the interconnect with the second waveguide, the interconnect comprising:

a substrate having a refractive index of the substrate; and a film comprising a refractive index contrast (RIC) polymer, the film coating the substrate and comprising:

a core comprising:

a first domain having a first refractive index;

a second domain adjacent to the first domain and having a second refractive index, the second refractive index less than the first refractive index; and a third domain adjacent to the second domain and having a third refractive index, the third refractive index less than the second refractive index;

disposing the second domain between the first domain and the third domain;

wherein the refractive index of the substrate is less than the first refractive index, the second refractive index, and the third refractive index; and wherein the RIC polymer comprises a polymer produced from a monomeric mixture comprising from about 10% to about 90% of trifluoroethylmethacrylate and from about 90% to about 10% of a non-fluorinated ethylenically unsaturated monomer comprising an acid labile protecting group.

12. The method of claim 11, wherein the first refractive index, the second refractive index, and the third refractive index are in a range of about 1.40 to about 1.65.

13. The method of claim 11, wherein the core further comprises a fourth domain adjacent to the third domain and having a fourth refractive index, the fourth refractive index less than the third refractive index, the method comprising:

disposing the third domain between the second domain and the fourth domain.

14. The method of claim 11, wherein the first waveguide and the second waveguide are misaligned.

15. The method of claim 11, wherein the core is produced by at least one of a mask lithography system, a maskless lithography system, or a direct laser writing system.

16. The method of claim 11, wherein the RIC polymer is produced from:

a photoacid generator.

17. The method of claim 16, further comprising:

photopatterning the RIC polymer to produce a photoexposed region and an unexposed region, wherein the photoexposed region results in removal of the acid labile protecting group, and wherein the photoexposed region has a different refractive index compared to the unexposed region resulting in the photoexposed region defining the core.

18. The method of claim 11, wherein the substrate comprises at least one of ethylene-tetrafluoroethylene (Tefzel™), polyvinyl alcohol, ethylene-vinyl alcohol, partially fluorinated acrylics, or perfluoropolyme.

19. The method of claim 11, wherein the RIC polymer has average molecular weight in the range from about 1,000 g/mole to about 1,000,000 g/mole.

* * * * *